US009448282B1

United States Patent
Meehl

(10) Patent No.: US 9,448,282 B1
(45) Date of Patent: Sep. 20, 2016

(54) SYSTEM AND METHOD FOR BIT-WISE SELECTIVE MASKING OF SCAN VECTORS FOR X-VALUE TOLERANT BUILT-IN SELF TEST

(71) Applicant: CADENCE DESIGN SYSTEMS, INC., San Jose, CA (US)

(72) Inventor: Dale Edward Meehl, Melbourne, FL (US)

(73) Assignee: Cadence Design Systems, Inc., San Jose, CA (US)

( * ) Notice: Subject to any disclaimer, the term of this patent is extended or adjusted under 35 U.S.C. 154(b) by 91 days.

(21) Appl. No.: 14/179,299

(22) Filed: Feb. 12, 2014

(51) Int. Cl.
G01R 31/3185 (2006.01)
G01R 31/3177 (2006.01)
G01R 31/317 (2006.01)
G01R 31/3183 (2006.01)

(52) U.S. Cl.
CPC ..... G01R 31/3177 (2013.01); G01R 31/31703 (2013.01); G01R 31/318335 (2013.01); *G01R 31/318536* (2013.01); *G01R 31/318547* (2013.01); *G01R 31/318563* (2013.01); *G01R 31/318566* (2013.01)

(58) Field of Classification Search
CPC .............. G01R 31/318547; G01R 31/318536; G01R 31/3177; G01R 31/318566; G01R 31/31703; G01R 31/318563; G01R 31/318335
USPC .................................................. 714/726, 732
See application file for complete search history.

(56) References Cited

U.S. PATENT DOCUMENTS

| | | | |
|---|---|---|---|
| 7,131,046 B2 * | 10/2006 | Volkerink et al. | 714/732 |
| 7,376,873 B2 * | 5/2008 | Vranken | G01R 31/31719 |
| | | | 714/30 |
| 7,487,420 B2 * | 2/2009 | Keller | 714/732 |
| 7,523,370 B1 | 4/2009 | Keller | |
| 7,818,644 B2 * | 10/2010 | Rajski et al. | 714/732 |
| 7,925,947 B1 * | 4/2011 | Touba et al. | 714/732 |
| 7,979,763 B2 * | 7/2011 | Wohl et al. | 714/728 |
| 7,979,764 B2 * | 7/2011 | Foutz et al. | 714/729 |
| 8,086,923 B2 * | 12/2011 | Cheng et al. | 714/726 |
| 8,250,420 B2 * | 8/2012 | Hapke | G01R 31/31919 |
| | | | 714/728 |
| 8,887,018 B2 * | 11/2014 | Narayanan et al. | 714/729 |
| 8,898,529 B2 * | 11/2014 | Goessel et al. | 714/729 |
| 2007/0067688 A1 * | 3/2007 | Vranken | G01R 31/31719 |
| | | | 714/733 |

* cited by examiner

*Primary Examiner* — James C Kerveros
(74) *Attorney, Agent, or Firm* — Rosenberg, Klein & Lee

(57) ABSTRACT

A system and method are provided for selective bit-wise masking of X-values in scan channels in an integrated circuit (IC) during a built-in self test (BIST). The composite mask pattern is selectively generated according to locations of X-values identified in a simulation of the IC. The composite mask pattern is stored on the IC and cyclically maintained while being applied to the operational scan results of the IC. The composite mask pattern is recycled over a plurality of scan iterations to effectively prevent the X-values from influencing the resulting signature of the BIST that represents a functional fingerprint of the IC and minimize storage requirements for the composite mask pattern.

20 Claims, 12 Drawing Sheets

SYSTEM AND METHOD FOR BIT-WISE SELECTIVE MASKING OF SCAN VECTORS FOR X-VALUE TOLERANT BUILT-IN SELF TEST

BACKGROUND OF THE INVENTION

The present invention is generally directed to a system and method for built-in self test (BIST) of a fabricated Integrated Circuit (IC) device to ensure proper operation thereof. With steadily increasing IC complexity, fabrication quantities, and IC reliance, there is an ever increasing need to verify proper operation of ICs without overly burdensome time and equipment requirements. Moreover, these verification measures should tolerate some uncertainties in the IC and yet still provide assurance of proper operation. Further still, verification measures should be resilient to changing operational parameters encountered after fabrication. Previous attempts in the art have not provided suitable measures.

Attempts have been made in the art within the fabrication and packaging facilities themselves to physically connect external automated testing equipment (ATEs) to input and output ports of ICs to stream known inputs and measure the outputs of the ICs. However, such an approach requires complicated physical mating or probing by testing equipment in clean room environments to each port of an IC and fails to suitably address on-going IC validation after deployment in the field with changing operational circumstances such as clock speed. For example, an IC used as a brake controller in an automobile cannot be continuously validated once the external testing apparatus has been disconnected and the IC has left the clean-room. However, validation of proper operation continuously, especially after the IC has left fabrication and is employed in the field is necessary, especially in light of changing operational conditions.

There is therefore a need for a system and method by which X-values (which may be unknown, indeterminate, out of bound, or other unexpected values—as opposed to standard expected values such as "0" and "1") may be selectively bit-wise masked without an undue loss of substantive operational diagnostic data and without undue added chip resources. There is therefore a need for a system and method by which bit-wise selective mask patterns may be generated and maintained on the IC and applied to the scan results of plural scan iterations to effectively prevent X-values from propagating into a functional fingerprint of the IC. There is therefore a need for a system and method of self test that is resilient and extensible across changing operational parameters encountered after fabrication of the IC.

SUMMARY OF THE INVENTION

It is an object of the present invention to provide a system and method for built-in self test (BIST) of a fabricated Integrated Circuit (IC) device to ensure proper operation thereof.

It is an object of the present invention to provide a system and method for selective bit-wise masking of X-values in operational scan results generated during BIST of a fabricated IC.

It is another object of the present invention to provide a selectively optimized bit-wise masking solution to maximize IC coverage and reliability in verification thereof.

These and other objects are attained in a system and method formed in accordance with the disclosure for a built in self test system incorporated in an integrated circuit (IC) with mask pattern storage on the IC. The system includes a test controller executing a plurality of scan iterations on operational portions of the IC to generate a plurality of bits representing operational scan results thereof. At least one scan vector unit maintains the plurality of bits representing the operational scan results from a scan iteration. An internal mask vector unit cyclically maintains a composite mask pattern including a plurality of bit-wise masking location values for the plurality of scan iterations of the IC. The composite mask pattern is sized to be no greater than the plurality of bits representing the operational scan results of a single scan iteration. Masking circuitry bitwise combines the plurality of bits representing the operational scan results with the composite mask pattern. A circuit signature unit coupled to the masking circuitry stores a signature representing the operational scan results.

A method implemented in accordance with certain embodiments disclosed herein provides for generating a composite mask pattern for built in self test of an Integrated Circuit (IC). The method comprises receiving a digital representation of an integrated circuit (IC) having a built in self test controller including at least an internal mask vector unit, masking circuitry, a scan vector unit, and a circuit signature unit. A processing unit executes to simulate operation of the IC executing a plurality of scan iterations on operational portions of the IC to generate a plurality of bits representing operational scan results from a scan iteration for maintenance in the scan vector unit. Bitwise locations of the scan vector unit storing X-values of the operational scan results are identified for each of the plurality of scan iterations. A composite mask pattern is generated to have a bit length no greater than the plurality of bits representing the operational scan results of a single scan iteration. Each of a plurality of masking bit values of the composite mask pattern is set according to the identified locations of X-values in the scan vector unit for the plurality of scan iterations of the IC.

A method implemented in accordance with certain embodiments disclosed herein provides for built in self test incorporated in an integrated circuit (IC), the IC having mask pattern storage on the IC. The method comprises actuating a test controller to execute a plurality of scan iterations on operational portions of the IC to generate a plurality of bits representing operational scan results thereof. The plurality of bits representing the operational scan results from a scan iteration are maintained in at least one scan vector unit. A composite mask pattern including a plurality of bit-wise masking location values for the plurality of scan iterations of the IC is cyclically maintained in the mask vector unit. The composite mask pattern is sized no greater than the plurality of bits representing the operational scan results of a single scan iteration. A masking circuitry is actuated for bitwise combining the plurality of bits representing the operational scan results with the composite mask pattern. A signature representing the operational scan results of the IC is maintained, in a circuit signature unit coupled to the masking circuitry.

Figure 1:
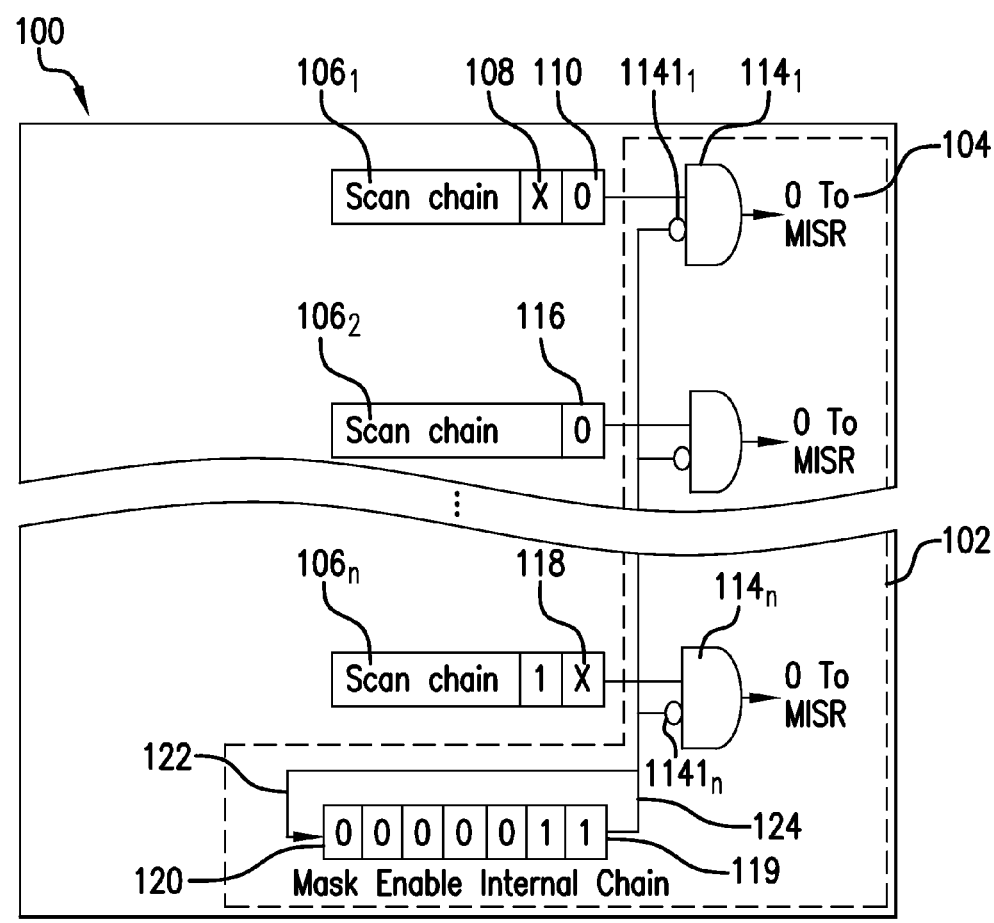
FIG. 1 is a schematic block diagram illustrating a representative portion of an enhanced built-in self test system formed in accordance with a first embodiment of the present invention.
Figure 1A:
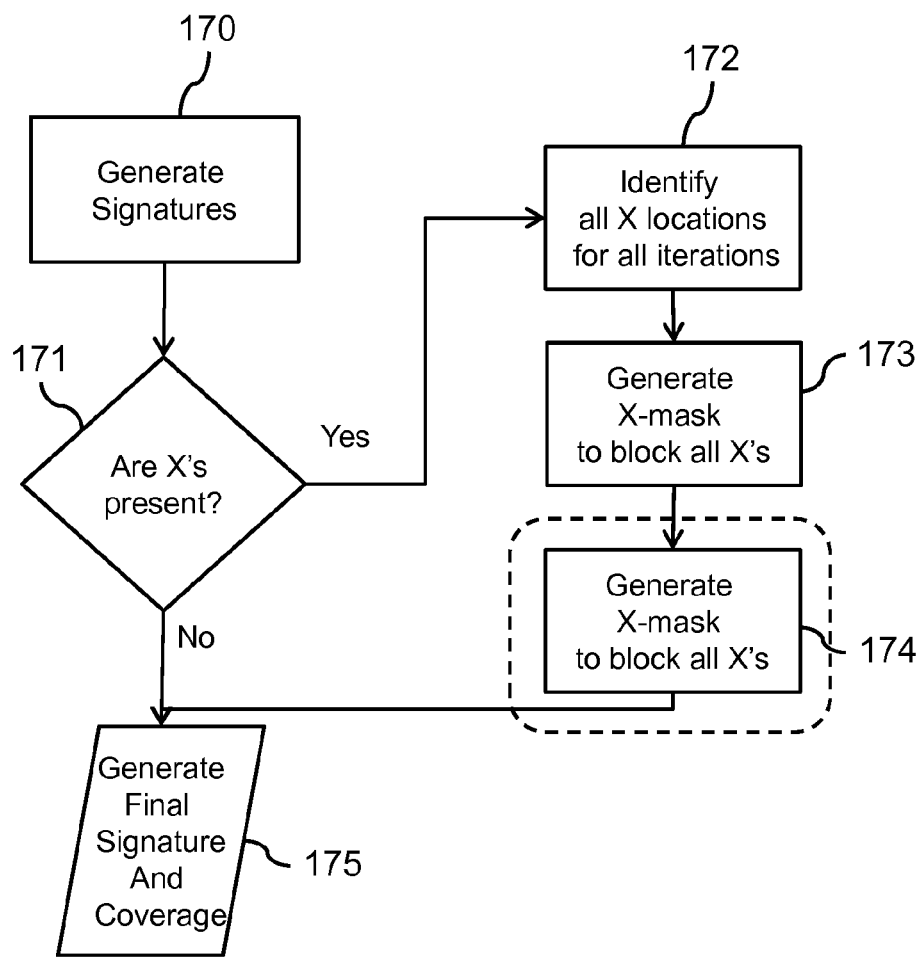
FIG. 1A is a simplified flow diagram illustrating a representative portion of a method for generating a composite internal bit-wise mask pattern for a built-in self test (BIST)
Figure 1B:
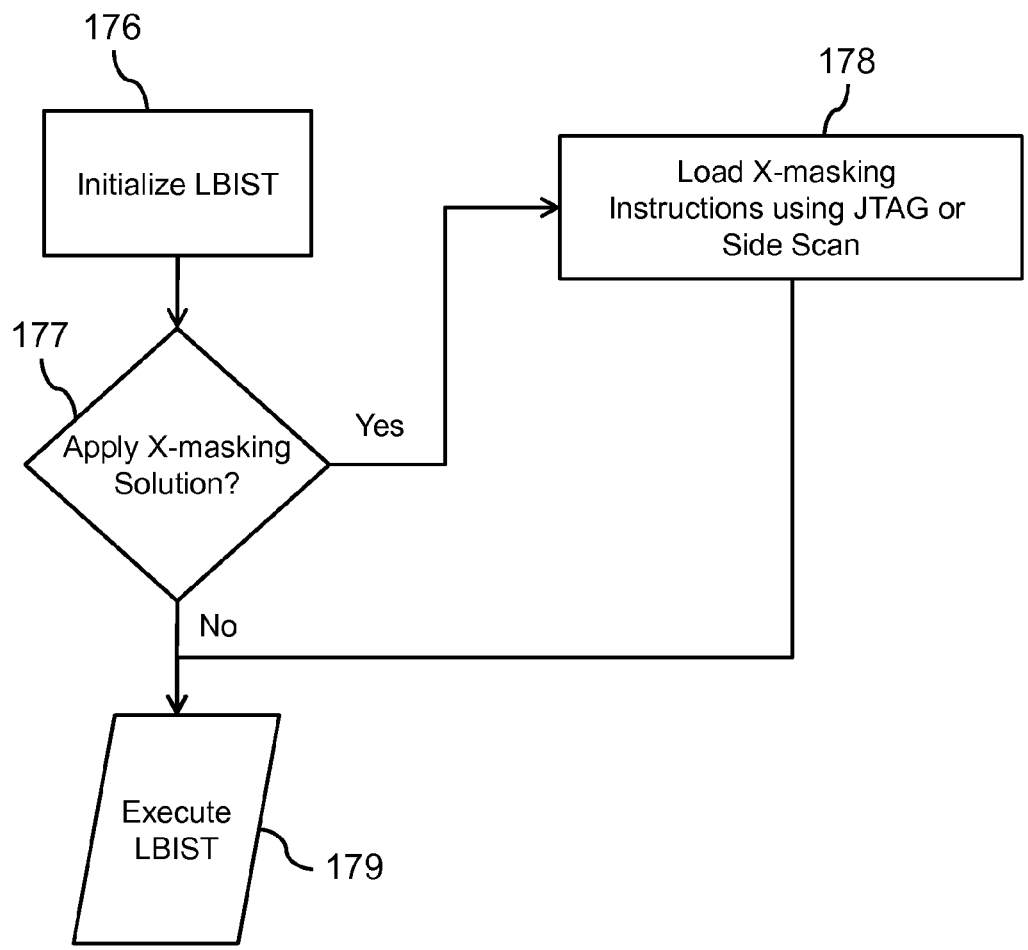
Figure 1C:
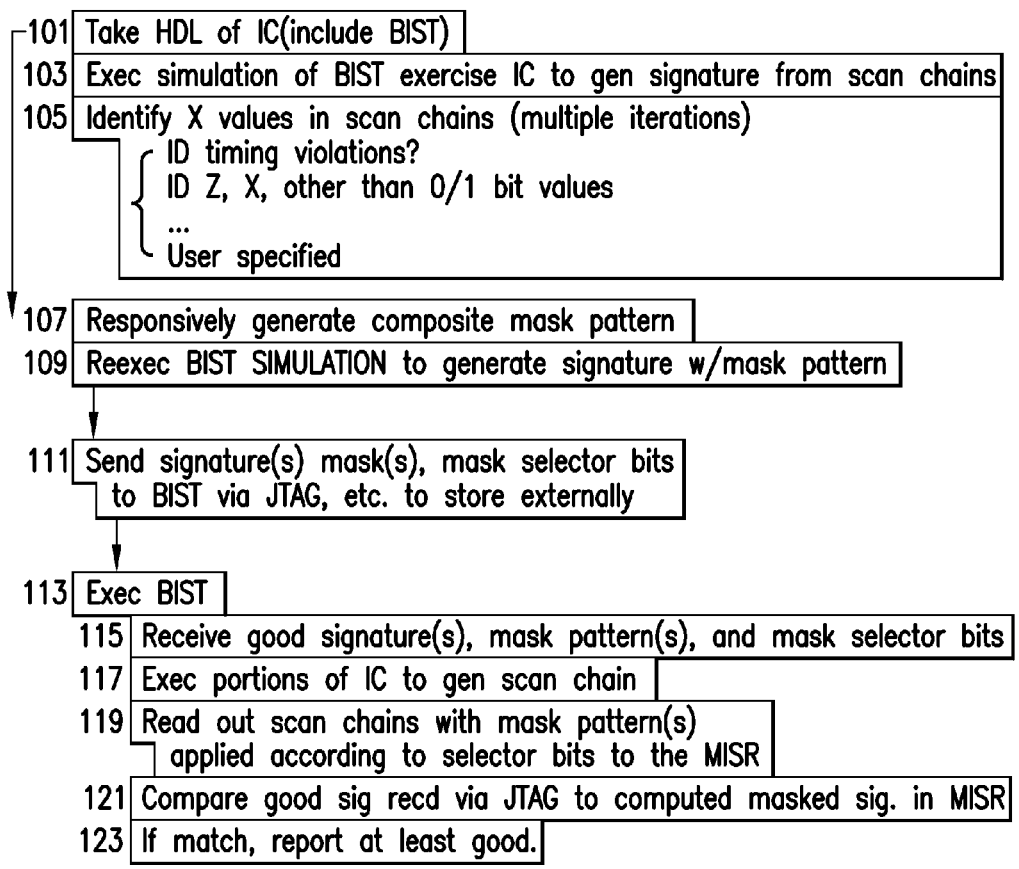
Figure 2:
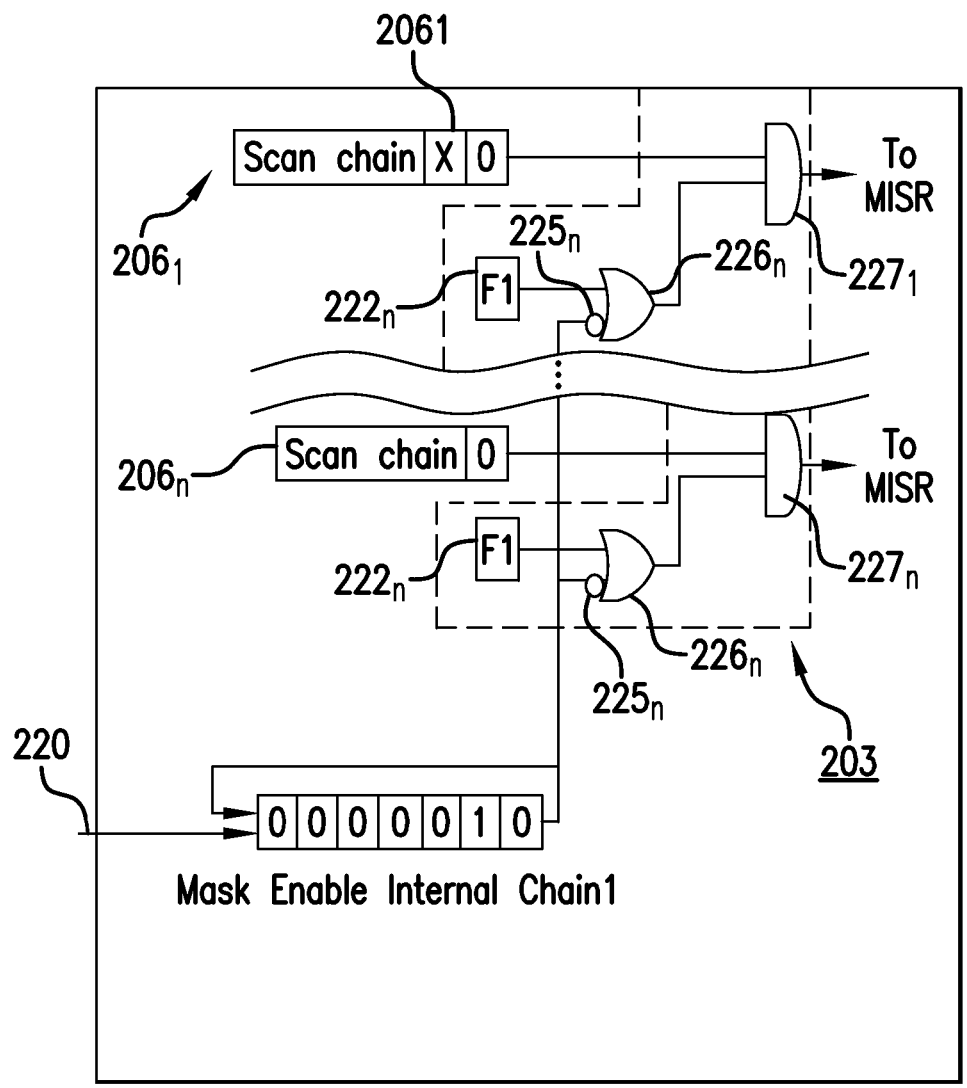
Figure 3:
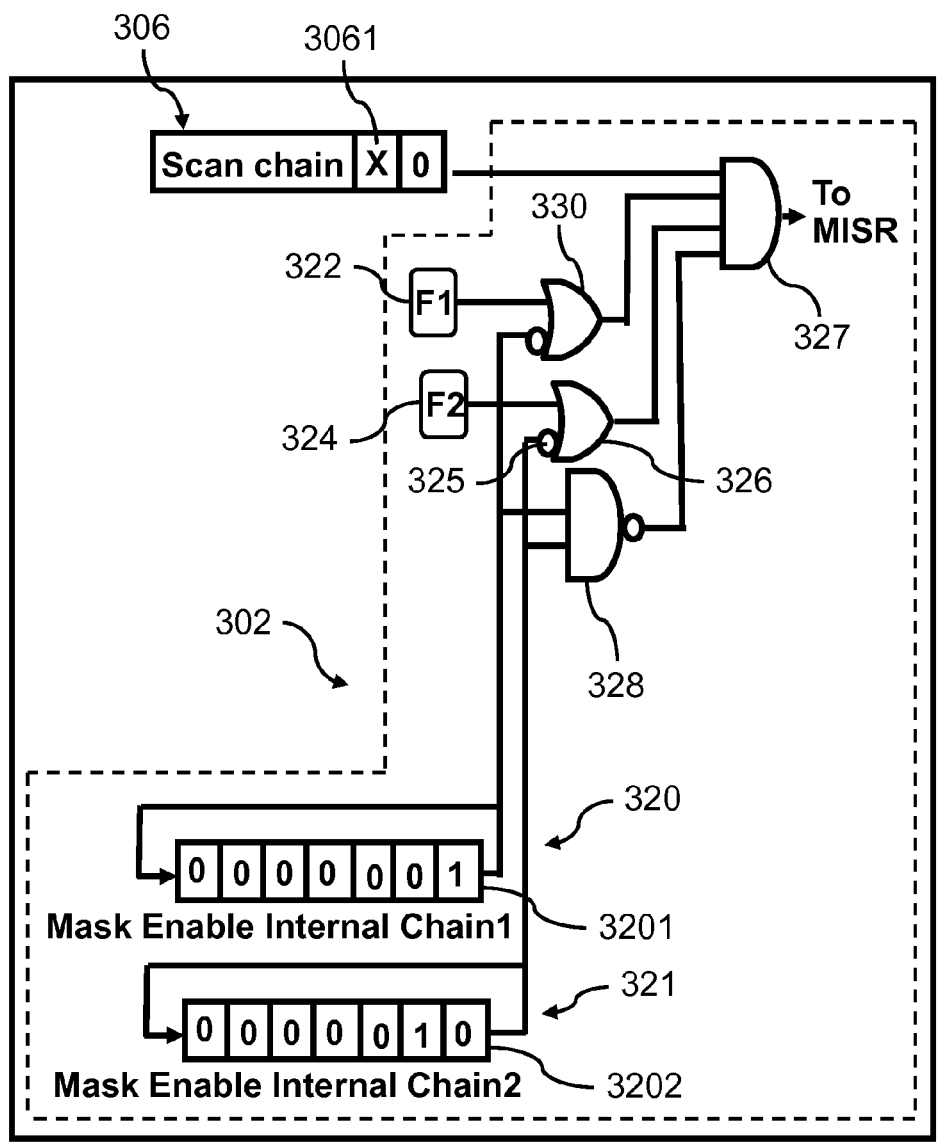
Figure 4:
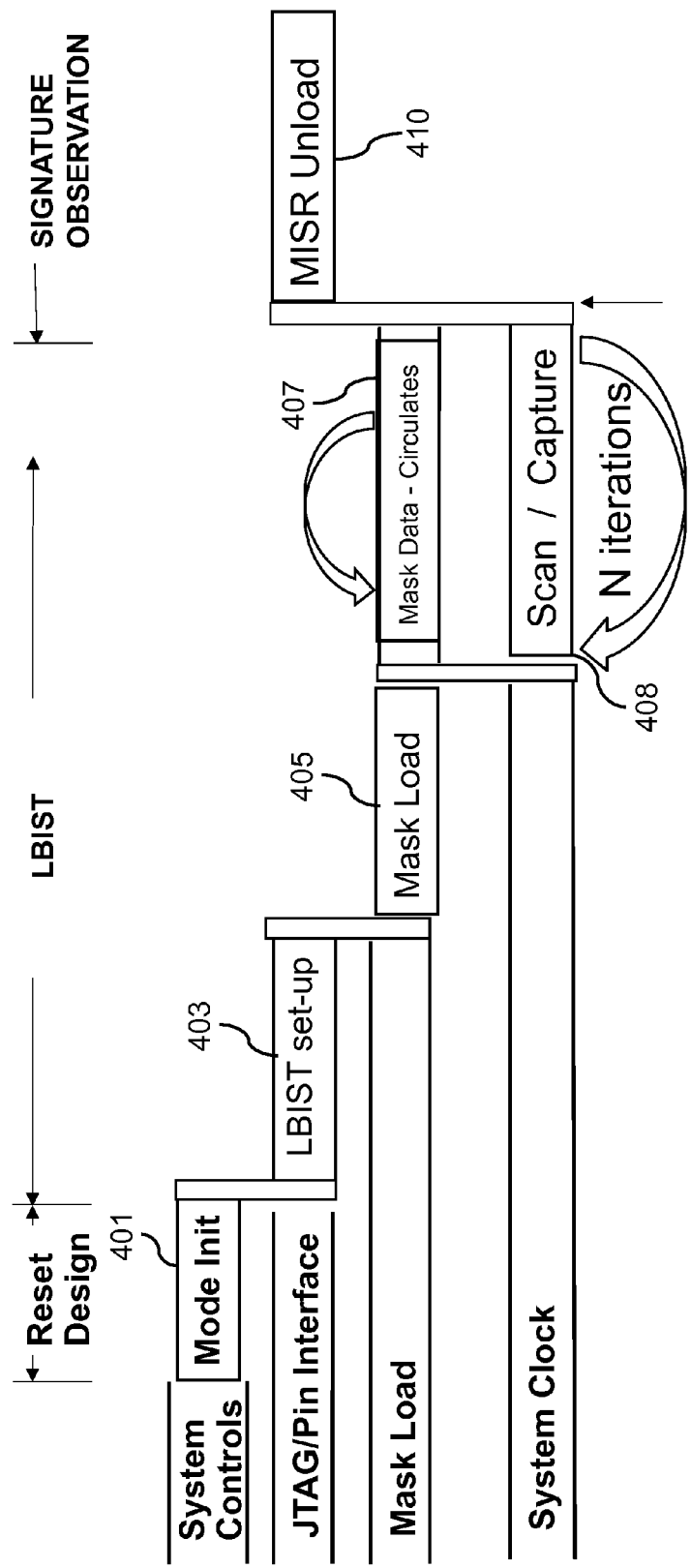
Figure 5:
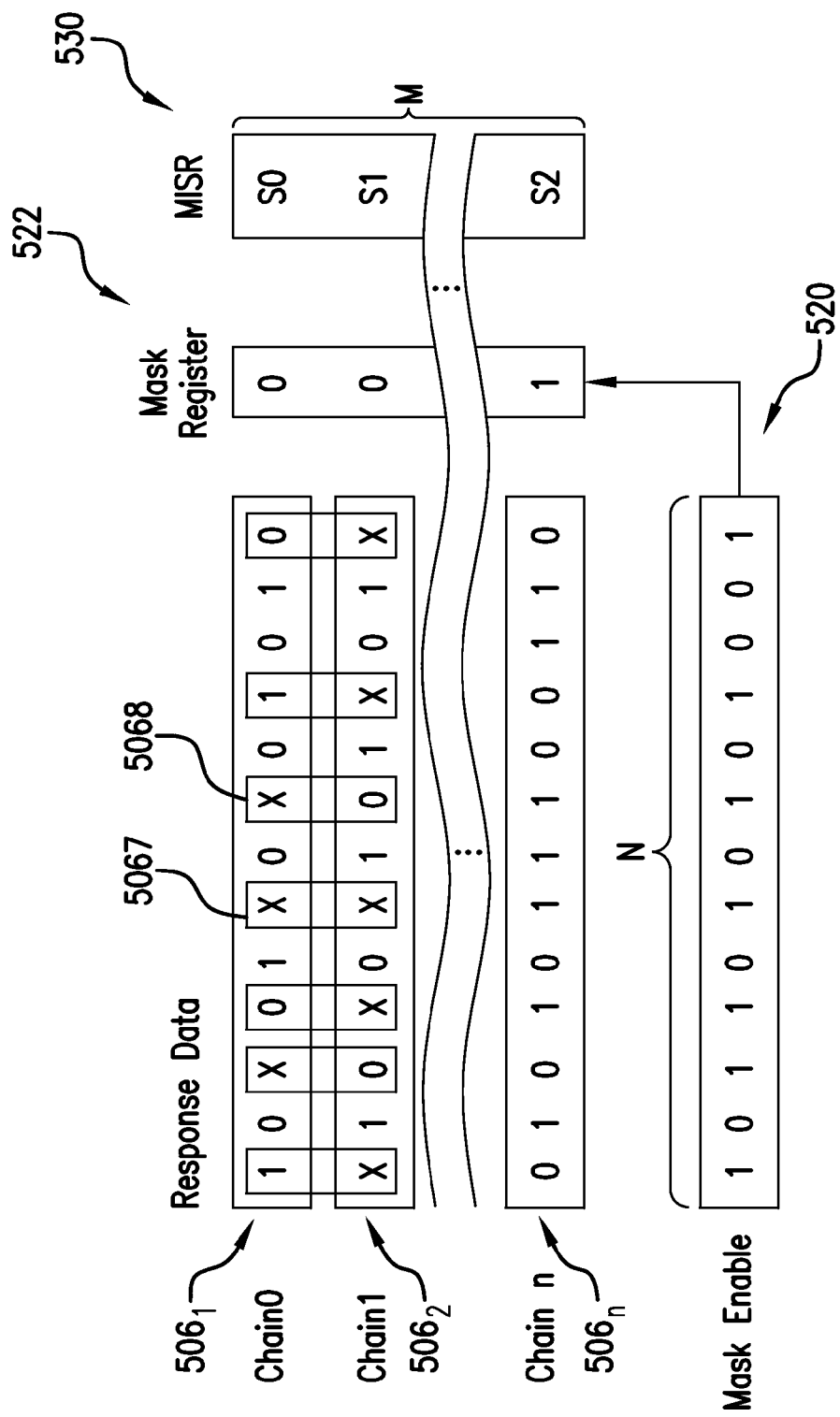
Figure 6:
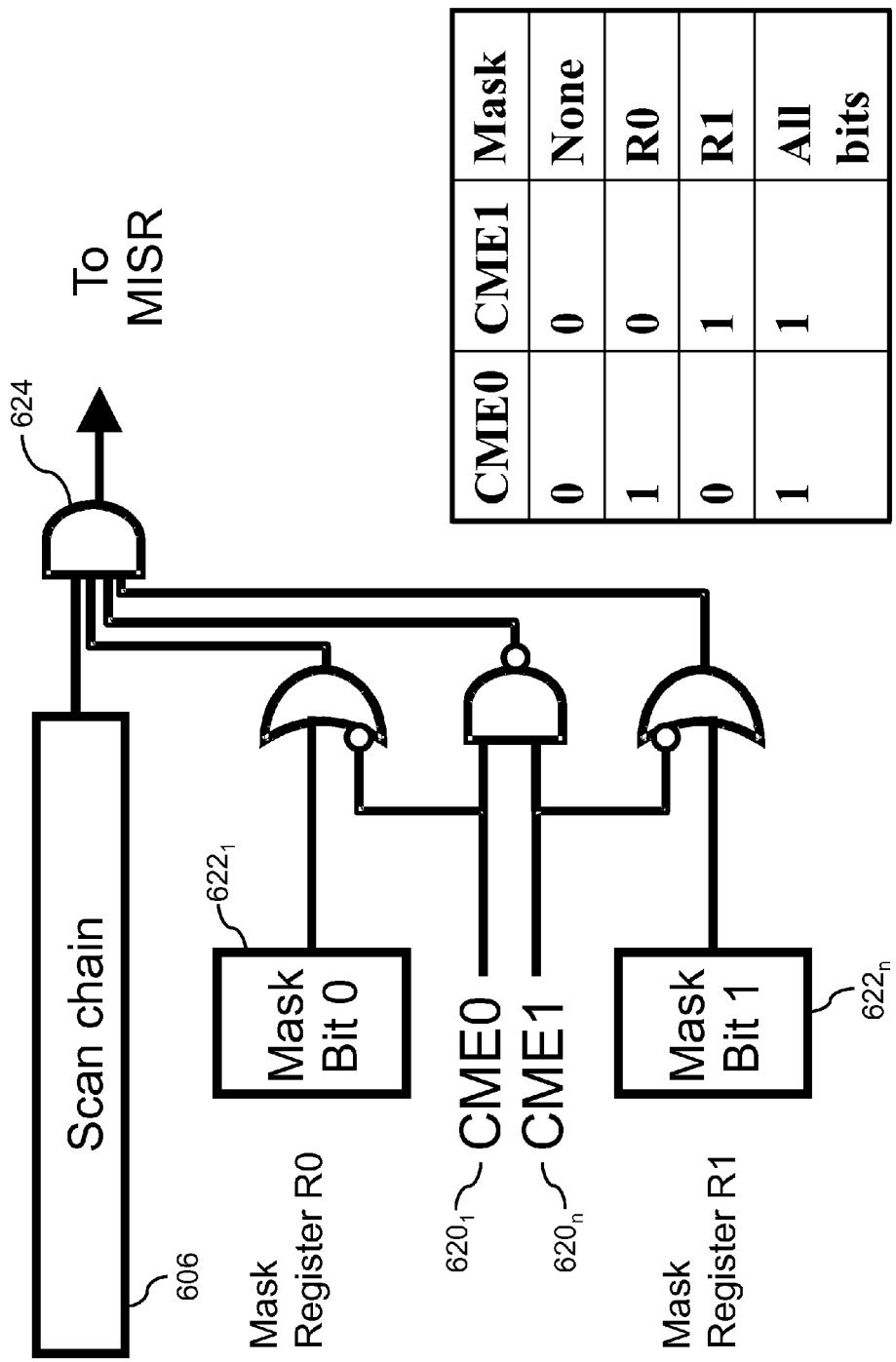
Figure 7:
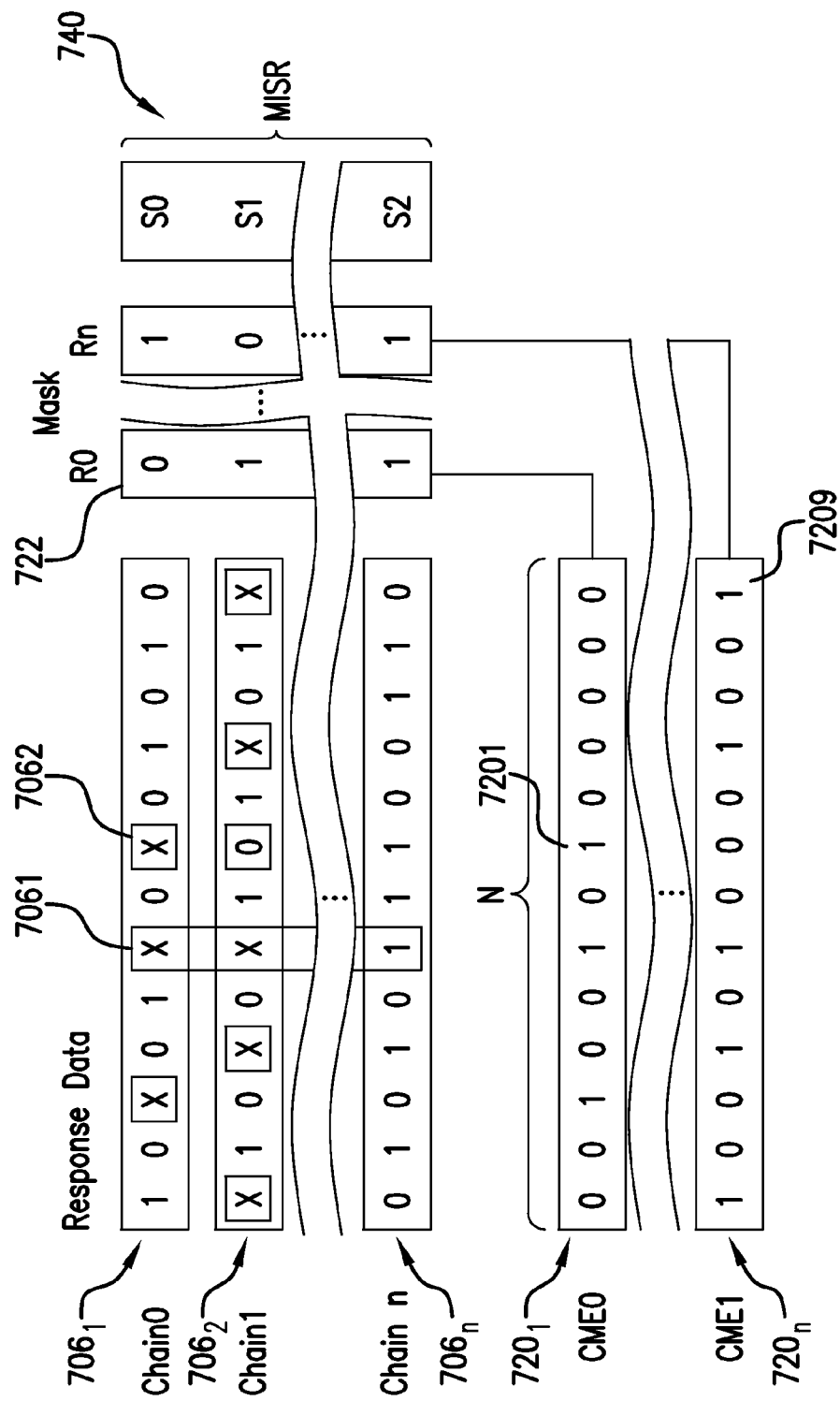
Figure 8:
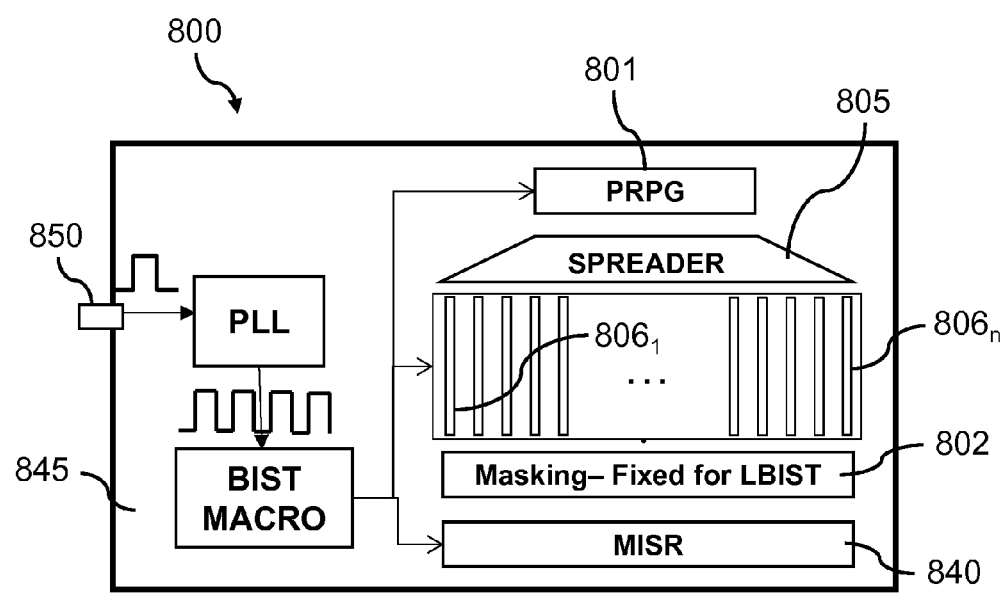
Figure 9:
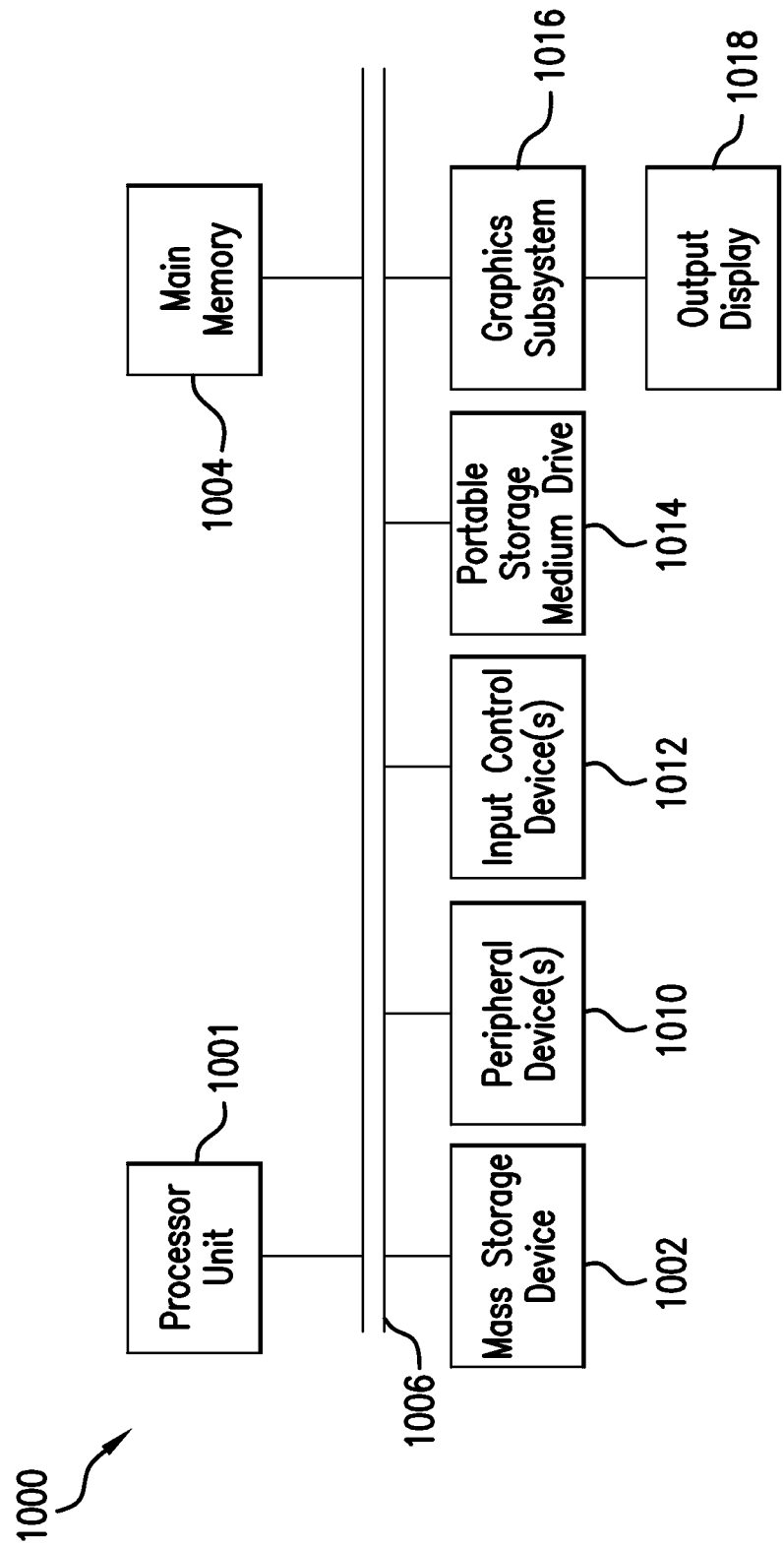

of an IC performed in accordance with one exemplary embodiment of the present invention;

FIG. 1B is a simplified flow diagram illustrating a representative portion of a method carried out by the built-in self test system illustrated in FIG. 1 for X-value tolerant BIST formed in accordance with one exemplary embodiment of the present invention;

FIG. 1C is a flow diagram illustrating a general flow of processes for creating a composite internal mask, inputting the mask to the BIST, and executing the BIST in accordance with one exemplary embodiment of the present invention to selectively mask X-values from the operational scan results;

FIG. 2 is a schematic diagram illustrating a representative portion of the enhanced built-in self test system formed in accordance with a second exemplary embodiment of the present invention;

FIG. 3 is a schematic block diagram illustrating a representative portion of the enhanced built-in self-test system in accordance with a third exemplary embodiment of the present invention;

FIG. 4 is a timing diagram schematically illustrating a general flow of processes carried out for bit-wise selective X-value masking in BIST;

FIG. 5 is a graphic plot showing an exemplary operation in accordance with the second exemplary embodiment of the present invention;

FIG. 6 is a schematic block diagram illustrating an exemplary configuration of a built-in self test unit in accordance with the third embodiment of the present invention;

FIG. 7 is a graphic plot illustrating an exemplary operation in connection with the configured system of the third embodiment, as seen in FIG. 6;

FIG. 8 is a schematic block diagram illustrating an exemplary embodiment of the built-in self test system in accordance with one exemplary embodiment of the present invention; and FIG. 9 is a schematic block diagram illustrating an exemplary interconnection of components in a processor-based system for implementing an exemplary embodiment of the present invention.

DETAILED DESCRIPTION OF THE PREFERRED EMBODIMENTS

The subject system and method provide for selective bit-wise masking of operational scan results generated from a built-in self-test (BIST) incorporated into an integrated circuit (IC). The subject system and method provide for a BIST which is tolerant of X-values (which may be unknown, indeterminate, out of bound, or other unexpected values—as opposed to standard expected values such as "0" and "1"). Such X-values may appear in the operational scan results of the IC. X-values may be the result of un-modeled logic, tri-stated or floating busses, timing violations, un-driven nets, non-initialized flip-flops or latches, and the like. A composite mask pattern is selectively generated according to identified locations of these X-values in scanned flip flops, registers, or memory elements of the IC during a simulation of that IC. The composite mask pattern is cyclically maintained through repeated bit-wise shifts with recycling of bits from a least significant bit position to a most significant bit position (or reversed, from most significant to least significant locations in recycling manner) and then adaptively applied to the operational scan results of the IC over a plurality of scan iterations to compensate for and effectively prevent the X-values from influencing a functional fingerprint of the IC.

The BIST, once initialized, operates in substantial isolation (save for optionally receiving an external clock pulse). As such, initialized values such as the mask pattern, mask selector bits, and the pre-calculated signature are not modifiable from outside the BIST during execution. Accordingly, the composite mask pattern preferably circulates to recycle the masking bits at least with each iteration of the BIST so as to maintain registration with the operational scan results in the scan vector units. In some embodiments, the mask pattern may be established to have less bits than the scan vector units or operational scan results therein to be masked. The mask pattern, in such an instance, is established to have a length that is a fraction of the scan vector units such that it will recycle periodically in a repeated manner within each iteration, maintaining registration with the scan results in the scan vector units. In such manner, an IC may be robustly verified with a BIST even though some X-values are encountered and without unduly masking indicative scan results.

Generally, in accordance with FIGS. 1-10, the disclosed system and method provide for bit-wise selective masking of X-values encountered in operational scan results of an Integrated Circuit (IC) by a Logical Built In Self Test (LBIST), hereinafter simply referred to as Built In Self Test (BIST), incorporated therein. X-values are values that may be output by a logic circuit that are unknown or unpredictable (i.e. values that vary from one test iteration to another). Sources of unknown values include tri-state logic or floating buses, uninitialized memory such as flip-flops, ram, registers, or latches, signals that cross clock domains in circuits with multiple clock domains, undriven nets or, and the like.

In accordance with certain exemplary embodiments of the disclosed system and method, a temporal and spatial composite internal mask pattern is generated and input into an internal mask vector unit within the BIST of the IC. The internal mask vector unit and composite mask pattern contained therein may be made of lesser length than the scan chains or scan vector units (used interchangeably) and the resulting operational scan results by employing a feedback circuit coupled to a shifting memory unit for cyclically maintaining the internal composite mask pattern. Additionally, a plurality of different mask patterns may be selectively employed according to identified X-values in operational scan results of scan vector units in the IC. Thereby, the subject system and method provide for a BIST which is tolerant of X-values without the need for a large storage capacity for storing masking patterns.

A composite mask pattern is selectively generated according to identified locations of these X-values in scan results generated from a simulation of the IC. The composite mask pattern is then adaptively applied to the operational scan results of the IC to compensate for and effectively prevent the X-values from influencing a functional fingerprint or signature of the IC that is the result of the BIST. In such manner, an IC may be verified with a BIST even though some X-values are encountered.

While various BIST measures are known in the art, they must generally be hard-coded statically for certain predetermined operating conditions and the IC must be substantially free of X-values. For example, previous BIST implementations required a hard-coded functional fingerprint generated at a predetermined operating frequency. If the operating frequency of the IC was later changed, the BIST would be rendered ineffectual as timing violations may result in X-values. X-values propagating into the circuit signature unit corrupt the circuit fingerprint. At differing operating frequencies, the BIST arrives at a vastly different functional fingerprint for the IC. With a different fingerprint, the BIST could not properly validate operation of the IC.

To provide some flexibility in the BIST, an approach was attempted whereby scan channels connected to portions of the IC would be wholly disconnected and ignored if a single X-value was present therein. However, this approach led to an overbroad exclusion of entire scan vector units holding usable operational scan results and therefore reduced reliability and coverage in the functional fingerprinting of the IC. What resulted was a much less reliable verification.

Turning now to FIG. 8, an overview schematic of an exemplary built-in self test system 800 is shown employing a clock signal 850, a built-in self test macro logic circuit 845, a pseudo random pattern generator (PRPG) 801 which supplies an automated test pattern to the functional logic of an integrated circuit under test. Any device suitable for providing predetermined input may be employed in place of the PRPG 801. PRPG 801 provides the input values for each iteration of the BIST to a spreader unit 805 to effectively input the values through the functional logic circuits of the integrated circuit being tested, from which data is captured in a plurality of different scan vector units $806_1$-$806_n$. The data captured in the scan vector units $806_1$-$806_n$ is then selectively masked according to the at least one masking pattern pre-stored within the internal mask vector unit of the masking logic circuit 802, as described in more detail below, to adaptively mask X-values stored therein and arrive at a known final signature or fingerprint for the BIST of the IC to thereby ensure valid operation. This final fingerprint or overall IC signature is calculated and held in the circuit fingerprint unit (herein seen as a MISR 840) for comparison with a calculated value, either internal or external to the IC. Such a built-in self test system 800 may be incorporated into an existing IC with little effort and little additional hardware logic.

The built-in self test system and the functional logic of the integrated circuit are also represented in a hardware descriptive language file such as HDL, VHDL, or any other suitable format for storing a representation of the IC and may be operated in simulated execution to determine the X-values and accordingly generate the mask patterns and mask selector values based upon the determined X-value locations. The mask patterns and mask selectors are applied in a second iteration of the simulation to calculate a final signature. The final signature, mask patterns, and mask selectors are then generally loaded into the actual fabricated hardware IC with BIST. The BIST is executed and the signature generated from the actual fabricated hardware IC is then compared with the simulator-generated signature or fingerprint to determine if the functional logic of the integrated circuit under test is performing acceptably.

Referring now to FIG. 1, certain portions are illustrated of an exemplary system 100 for bit-wise selective masking to enable X-value tolerant built-in self test (BIST) of an integrated circuit (IC). System 100 is incorporated into an integrated circuit (IC) and is fabricated with the IC. System 100 may re-employ functional portions of the IC such as memory elements, registers, and flip-flops for built-in self-test purposes. It is the underlying functional logic and interconnections that the BIST seeks to validate. The BIST is executed to evaluate a plurality of components of the functional IC that it is incorporated into to validate proper operation thereof. The integrated circuit itself is generally designed to accomplish a substantive purpose, such as, for example, the IC may have been fabricated to be a system on chip (SOC) for a smartphone, a brake controller, or the like. The built-in self test may execute at initialization of the IC to input a plurality of values, generated by a pseudo random pattern generator (PRPG), an automatic test pattern generator (ATPG) integral to system 100.

In such manner, a plurality of input values are successively provided to the functional circuits of the IC for evaluating the operation thereof. An IC generally has a number of memory elements such as flip-flops, registers, and the like that are designed to be used to store values during substantive operation of the IC. During BIST, some of these memory elements may be collectively re-purposed and employed to hold input, intermediate, and output values generated during the BIST operations of the IC. The memory locations holding the resulting outputs of the logic circuits under test at particular points in time may collectively be referred to as scan chains or scan vector units $106_1$-$106_n$ (used interchangeably herein). Scan vector units $106_1$-$106_n$ are employed to store, for example, a vector, which is a one-dimensional array of 0 and 1 binary values.

The disclosed system and method is not limited to a binary logic system, but may employ a ternary logic, quaternary, five-state logic, IEEE 1164 nine-valued logic, or any multi-valued logic. In the illustrative block diagram, the scan vector $106_1$ may be employed for a first portion of the IC. Similarly, scan chain $106_2$ and scan chain $106_n$ may likewise be used to store results from different respective portions of the IC. Each scan chain $106_1$-$106_n$ preferably stores a vector of a plurality of bit values such as seen in bit location 108 and bit location 110, respectively representing an X-value, and a 0 value (which is a binary value representing "OFF", logical "NO," or "FALSE"). Each bit location is also operable to store a binary value of "1" which represents "ON", logical "YES," or "TRUE."

Bit locations 108 and 118 illustratively store X-values in the executing snapshot of FIG. 1. Bit locations 108 and 118 illustratively show X-values which would lead to corruption of the signature or fingerprint if they were allowed to propagate through to the multiple input signature register (MISR) 104. MISR 104 (interchangeably referring to a multiple input shift register or multiple input signature register herein) is an exemplary structure employed in this embodiment to function as a circuit signature unit 104 to establish a signature for the circuit under test at the conclusion of the BIST. The use of a MISR in conventional BIST systems is well known in the art and therefore not described in any detail herein. In a preferred embodiment, a MISR unit is employed; however, any suitable memory and logic circuit structure may be employed.

System 100 executes multiple operations or iterations of portions of the IC in response to a multitude of input bit patterns to thereby generate a plurality of intermediate and output bit values representing operational scan results, for example, the bit patterns stored in memory scan vector units $106_1$-$106_n$. Any suitable number of scan vector units to represent the different portions of the IC may be employed, and different scan vector lengths may also be employed. The scan vector length depends on the number of scan-able flops in the longest channels and desired scan lengths or run times. An exemplary length may be on the order of 4000 to 10000 bits per scan vector and is generally dependent upon the complexity of the IC, which in turn determines the number of bit patterns required to test the device, although any suitable length may be employed.

The IC is exercised to produce a plurality of values in the scan vector units $106_1$-$106_n$. These scan vector units may be employed in a stack-type arrangement with a first in/first out (FIFO), last in/first out (LIFO) paradigm or the like. Suitable stack pushing and popping operations and the like which are known in the art may be employed. A shift register or other memory and logic circuitry may be employed to implement the scan vector units.

Each scan vector unit $106_1$-$106_n$ has a plurality of bit locations which may representatively be seen as having a least significant bit position such as a rightmost bit and a most significant bit position which, for example, may be a leftmost position. A plurality of intermediate bit locations storing bit values disposed between the least and most significant bit positions are generally provided as well. This assignment of most and least significant bit positions is not for the purpose of assigning a value to the contents of the scan vector units, but only as reference to bit locations in the register or memory that define the scan vector unit.

A mask enable internal chain 120, also referred to as an internal mask vector unit 120 is similar to scan vector unit 106 in that it preferably stores a vector or one-dimensional array of bit values. The internal mask vector unit 120 is selectively sized according to the bit length of the scan chains $106_1$-$106_n$. The internal mask vector unit 120 may be sized to be equal to the scan vector unit 106 length. A further savings in IC real estate can be achieved by the inventive use of the internal mask vector unit 120 being sized to have a length that is a fraction of the scan vector unit length.

Once the BIST is executed, it executes autonomously without taking input from sources external to system 100. For that reason, the mask pattern may be fixed at the time of IC fabrication, be part of the IC's firmware or fixed at the time the BIST execution has commenced. Once execution of the BIST has commenced, the internal mask vector unit 120 is inaccessible external to system 100. The internal mask vector unit 120, rather than being configured to be the same size as scan vector unit 106, may be a fractional value of the length of the scan vector unit 106. For instance, the internal mask vector unit 120 may be half the size, a quarter of the size, or an eighth of the size of the scan vector units. Any suitable fractional size relative to a scan vector unit may be employed. Thus, for example, where a scan vector unit has a length of 12 bits, the mask pattern may be selectively sized to be 3 bits, 4 bits, 6 bits, or the like, and those mask pattern bits are fed back and recycled through the internal mask vector unit 120, such that the mask pattern cyclically maintains registration/correlation with the bits of the scan vector unit 106.

As stated above, the internal mask vector unit 120 is inaccessible from external to system 100 during execution, if at all. To minimize the on-chip masking pattern storage requirement, a feedback mechanism is used to re-circulate the masking pattern stored in the internal mask vector unit 120. Thus, the same mask pattern is used for at least each iteration of the BIST or fractional portions thereof. The internal mask vector unit 120 synchronously shifts mask pattern bits to the output of the internal mask vector unit 120 and they are also fed them back to an input thereof to incrementally refresh the mask pattern. The masking pattern contained in the internal mask vector unit 120 is generated to correspond in a bit-wise location fashion to the scan chains $106_1$-$106_n$ for the sum total of iterations. For example in a first iteration, during a first readout operation, a first value is illustratively read from bit location 110, the least significant bit of scan vector unit $106_1$. In the same operation, the least significant bit 116 is read from scan chain $106_2$, and all of the least significant bits of the other scan chains through the least significant bit 118 of scan chain $106_n$. The internal mask vector unit 120 is accessed and a least significant bit location 119 of the masking pattern contained therein is output to output line 124 and applied to a feedback mechanism, illustrated by the line 122, that couples the bit value to the input of internal mask vector unit 120, which is preferably a linear feedback shifting register (LFSR).

The masking pattern stored in the internal mask vector unit 120 includes a plurality of binary values including 0s and 1s. The mask pattern is established to have a bit value of 1 to represent a mask enable and is stored at each bit-wise location corresponding to an X-value in any of the scan chains $106_1$-$106_n$ in any of the iterations of the BIST. Alternatively, a 0 may be used to denote a mask enable for identified X-values along with the appropriately corresponding masking logic being used in system 100. In the example illustrated in FIG. 1, each bit of the masking pattern stored in internal mask vector unit 120 is sequentially read out and a shift of one bit location to the right of every other bit therein is employed in correspondence with the read out and shifting of the mask vector units 120. Each bit shifted out of the least significant bit location is coupled to the input of the scan vector units 120 and shifted into the most significant bit location. Thus, as each bit from the least significant bit location, bit location 119, is read out and applied to the output line 124 and feedback mechanism 122, this bit value circulates back through a feedback mechanism to repopulate the internal mask vector unit 120 at the most significant bit position as the bits therein shift right one location.

The least significant bit 119 is applied in a mask controller 102 which adaptively masks X-values, such as is correspondingly shifted from bit location 118 and then, in the next cycle, the X-value shown in bit location 108. In this exemplary embodiment, the mask controller 102 includes a plurality of logic gates; however, any suitable controller or logic circuit may be employed such as a micro-controller, microprocessor, multiplexor network, and the like.

Looking at scan chain $106_n$, an X-value is presently in the least significant bit, bit location 118 of the scan chain $106_n$. When the X-value is applied to the AND gate $114_n$, it will have no effect as it is masked by the logic 1 value output from the internal mask vector unit 120 and will effectively prevent that X-value from reaching the circuit fingerprinting unit 104, as the logic 1 masking bit value forces a logic 0 value output from the AND gate $114_n$. The mask pattern least significant bit 119 is applied to a line 124 which provides an input to the AND gate $114_n$ of the mask controller 102 through an inverter $1141_n$. The inverter $1141_n$ inverts the positive, TRUE, or 1 value of the masking pattern to a 0 input to the AND gate $114_n$. AND gate $114_n$ logically combines the X-value applied to another input of AND gate $114_n$ with the inverted mask value at the other input thereof to output a logical FALSE represented as a "0", irrespective of the actual logical value of the X-value. In such manner, the X-value is effectively forced to a logical "0" and transmitted to the circuit fingerprinting unit 104 (represented as MISR herein), and does not affect the end result of the signature, which is may be a modulo accumulation of values of all of the scan iterations.

In scan chain $106_1$, the least significant bit, "0" in location 110 is applied to a first input of a first AND gate $114_1$. Substantially at the same time, the corresponding "1" value of the masking pattern stored in the internal mask vector unit 120 and output on line 124 is applied to a second input of AND gate $114_1$. The "1" value of the masking pattern on line 122 is inverted by inverter $1141_1$ to be a "0" input to the AND gate $114_1$. Thus, in this case, the masking of this bit has no effect as the two "0" inputs to AND gate $114_1$ will result in a "0" output, transmitted from the mask controller 102 to arrive at the circuit fingerprinting unit 104 and therefore also does not influence the resulting signature for the circuit under test. This would affect the simulation tool's fault mark-off at this location as the "0" in the channel will be masked. The signature is the same, but the simulation tool is preferably made aware of this to avoid marking off faults at this location in the scan chain. Alternatively, had the bit value of location 110 been a "1", the output of gate 114$_1$ would still be a "0". This result is known as over-masking, as a valid result is masked. While one X-value transmitted to the MISR 104 can be tolerated, as such would result in two possible valid signatures in the MISR 104, two or more X-values would result in a corrupted signature that cannot be resolved. The majority of faults in the circuit under test are detected by many different ones of the multiple patterns that are input thereto. Therefore, if some of the known (valid) bits are masked due to over-masking, faults in the scan chain of the circuit under test will still be detected in other iterations. Hence, over-masking as a cost to prevent X-values from transmission to the MISR 104 is a reasonable tradeoff.

A bitwise sequential retrieval of each of the corresponding least significant bit locations, bit locations 110, 116, 118, and 119 are applied to the mask controller 102. As each of the bits are output from these locations, the next more significant bits shift rightward to the next respective less significant bit location and the retrieved bits are thereby replaced. The retrieval is sequentially performed until all of the scan vector units 106$_1$-106$_n$ have been processed. This sequence is repeated for a plurality of iterations for different sets of bits input to the circuit under test, each generating scan chain vectors to repeatedly fill scan chains 106$_1$-106$_n$. The internal mask vector unit 120 employs recirculation of the pre-loaded masking pattern stored therein to apply that masking pattern in synchronism with the scan chains 106$_1$-106$_n$ to the mask controller 102, such that at least after each iteration the mask pattern has been restored to its original sequence. Therefore, the masking pattern must provide for the masking of X-values in any of the iterations. As the generation of an X-value is a rare occurrence, the over-masking that results from this scheme does not have a significant impact on the BIST's ability to identify a faulty IC.

Turning to FIG. 1A, an exemplary flow diagram illustrating a process for generating operational scan results and composite mask patterns is illustrated. The flow of the process illustrated FIG. 1A is performed within a circuit simulator on a processing unit or units. At block 170, a definition file representing the IC, such as provided by a Hardware Descriptive Language (HDL), Verilog, VHDL, or the like, may be employed to capture the functional and structural aspects of the IC. Any suitable data structure may be employed to represent the IC. The simulation is run and at least one operational scan result is generated at block 170. Through the simulated execution of the IC, the data structures in the simulation representing the scan chains 106$_1$-106$_n$ are populated with generated scan results, and the simulated scan chain units are sequentially offloaded into the simulated circuit fingerprint unit. The simulation application, such as, merely for example, Encounter Test (ET), or any other suitable simulation application, may be employed to generate these operational scan results of the IC at block 170 and evaluate each of the scan chains and the circuit fingerprint unit for X-values.

Once the data structures representing scan chains 106$_1$-106$_n$ in the simulation are populated with scan data from exercising respective portions of the IC, a decision block 171 is executed to determine if any X-values are present in any of the simulated scan chains/vectors 106. If there is at least one X-value present, then flow proceeds to block 172 where all of the X-locations for all of the iterations are identified. This identification may be through any measures as would be known to one of skill in the art such as a look-up table, a database, a mask pattern, or the like. Such identification may be stored as an iteration number, a scan chain identifier, and a bit position or as a bit location in the scan chain.

Flow then proceeds to block 173. A first mask pattern is generated according to a temporal and spatial sum (OR-ing) of all identified X-locations in all of the data structures representing scan chains 106$_1$-106$_n$ with respect to all of the iterations. In other words, the mask pattern is made over-inclusive to block each bit location where any single one of the scan chains has an X-value during any of the iterations. For example, if an X-value appears as a least significant bit in one scan chain 106$_1$ at bit location 1 (least significant bit) and an X-value appears in the most significant bit of a second scan chain 106$_n$ at bit location 3000, then the composite masking pattern provides a masking bit, a "1", in both the least significant and most significant bit locations. Further, if one of the scan chains 106$_1$-106$_n$ has an X-value at the bit location 1000 in the 300$^{th}$ iteration, then the composite masking pattern will provide a masking bit, a "1", in the 1000 bit location in addition to the least significant and most significant bit locations. In accordance with the example of FIG. 1, the flow of FIG. 1A would skip optional block 174 and utilize the single mask pattern for all of the scan chains. Where the mask vector unit has a length that is a fraction of the scan chains, the position of the mask enable bits ("1"s) must additionally take into account the reuse of the masking pattern during each iteration. Therefore, in the example of three X-values above, if the scan chains are 3000 bits long, and the composite mask pattern is 1500 bits long, "1" values will be placed in bit positions 1, 1000 and 1500 for this simplified example, thereby increasing the degree of over masking as a cost of saving masking pattern storage space.

Alternatively, as will be seen in further circuit arrangements of system 100 and will be described in the following paragraphs, at least a second mask pattern is generated at block 174. The secondary mask pattern may be the result of an optimization loop determining, for example, a number of diagnostically usable substantive "0" and "1" binary data which is being needlessly masked by the use of a single overly-broad mask pattern, as in the first example discussed. If it is determined that using two, or a plurality, of separate mask patterns with a minimal addition of flip-flops, registers, or other memory elements and associated masking circuitry logic enhances IC coverage at a low overhead, then the plurality of mask patterns may be implemented in system 100 and selectively applied to separate sets of scan chains. The additional masking patterns may then accordingly be generated. The flow then proceeds to block 175 where a final signature or functional fingerprint of the IC is again generated in light of the masking pattern(s) generated at block(s) 173-174. In such manner, a final signature or fingerprint of the entirety of the IC is generated with the X-values identified therein and selectively masked to avoid corrupting the functional fingerprint of the IC. The simulation tool preferably also generates a fault coverage for the desired BIST run by indicating locations of faults in the various scan vectors—this is preferably performed in the simulated BIST execution during optimization of masking patterns.

Turning now to FIG. 1B, at block 176, the BIST is initialized. Flow then proceeds to block 177 where a determination of whether to apply a masking solution is evaluated. If the result is in the affirmative, then the flow proceeds to block 178 where the masking pattern is preferably loaded into the built in self test system 100 via a joint test action group (JTAG) interface or IEEE 1149.1 standard TDI line. The JTAG interface or other input/output means such as a side scan or direct memory access allows the loading of the mask pattern generated in accordance with FIG. 1A. The flow then proceeds to block 179 where the BIST is executed and scan chain results are accumulated and sequentially transferred into the circuit fingerprint unit 104 with masking applied via the mask controller 102 applying the mask pattern stored in the internal mask vector unit 120.

FIG. 1C outlines an overall order of BIST generation and masking operations starting at block 101 where the Hardware Descriptive Language (HDL) of the IC including the built in self test system 100 is loaded into a circuit simulator. At block 103, the simulation of the test is executed to exercise portions of the IC to generate at least one operational scan result into at least one simulated scan vector unit 106. At block 105 X-values in the operational scan result are identified such as by identifying failed timing analyses, high impedance Z-values, undriven nets, un-modeled logic, and explicitly specified locations designated by a circuit designer or user. At block 107, at least one composite mask pattern is responsively generated based on the identification of the X-values in the operational scan result. The composite mask pattern is loaded into the simulated internal mask vector unit 120 and the simulation is re-executed with the simulated mask controller 102 actuated to mask the identified locations of X-values. The re-execution at block 109 generates a functional fingerprint or circuit signature of the IC based on the masked operational scan results.

At block 111, at least the composite mask pattern is loaded onto the fabricated IC. If the BIST is to give a go/no-go or success/failure signal, then the calculated functional fingerprint from the simulation is loaded as well for an on-IC comparison with a functional fingerprint generated thereon. This comparison of the simulation generated functional fingerprint and the fabricated IC generated functional fingerprint results in a fail/pass signal from the BIST upon completion thereof. Alternatively, if the fabricated IC with BIST is to output the functional fingerprint for comparison external to the IC, the IC will output the functional fingerprint it generates.

At block 113, the BIST of fabricated IC is executed. The composite mask pattern and the simulation-generated functional fingerprint are received by system 100 at block 115, if the fabricated IC has not already been preloaded with the composite mask and/or functional fingerprint. At block 117 at least one portion of the IC is executed to generate at least one operational scan result in the scan vector units $106_1$-$106_n$. The composite mask pattern is applied through the mask controller 102 at block 119 to mask X-values in the scan vector units 106 as the operational scan result is transferred to the circuit fingerprint unit 104. Depending upon the complexity of the BIST, the pre-loaded simulation-generated functional fingerprint is compared with the actual functional fingerprint derived from the testing in the circuit fingerprint unit 104 at block 121. According to the comparison, a result is reported at block 123.

FIG. 2 shows an alternative configuration of system 100, with a single internal mask vector unit 220 being applied to a plurality of scan chain units $206_1$-$206_n$. A number of selector units $222_1$-$222_n$, each including a flip-flop, as an exemplary implementation, to allow for selective application of the masking pattern to corresponding scan chains associated therewith. Additionally, if, according to an identification stage as discussed above, no X-values are in a given scan chain $206_1$-$206_n$, no masking pattern is applied to the output of that scan chain unit in the mask controller 203, absent the scan chain unit having an X-value in some other iteration (since the masking pattern is reused for at least each iteration). In this instance, an exemplary mask controller 203 is shown to include the masking AND gates $227_1$-$227_n$, OR gates $226_1$-$226_n$, inverters $225_1$-$225_n$, and selector units $222_1$-$222_n$ controlling selective application of the internal mask vector unit 220 to the individual scan chains $206_1$-$206_n$.

The selector units $222_1$-$222_n$ are considered part of the masking logic along with internal mask vector unit 220, gates 225, 226, and the like. When the masking logic is presented to the simulation software, it identifies if the selector flops are to be used based on the X-values encountered in the simulation software. If the selectors are to be used to more narrowly tailor the mask to block X-values while minimizing the masking of scan test data, the simulation software uses this information in the generation of the masking signatures for both the internal mask vector unit 220 and the selector units $222_1$-$222_n$. The internal mask vector unit 220 and selector units $222_1$-$222_n$ are preferably loaded or set during the mask load operation. The selector units' $222_1$-$222_n$ respective flops are preferably pre or postpended to the masking values to enable loading thereof from the simulation unit.

Once the selector units $222_1$-$222_n$ are loaded, they will not be updated during the masking process, but will, instead hold their values for the length of the test. A difference is seen between FIG. 2 and FIG. 3 in that with a single selector unit (as in FIG. 2) there is either an "enable masking" for a corresponding scan vector $206_1$-$206_n$ or "no masking" for the scan vector. On the other hand, with the plural selector units (in this example two—as illustratively seen in FIG. 3), there are at least four possible selectable configurations for the masking of the scan vector.

| F1 | F2 | Mask |
|---|---|---|
| 0 | 0 | Either mask enable vector 1 or 2 will control |
| 0 | 1 | Only mask enable vector 2 will control |
| 1 | 0 | Only mask enable vector 1 will control |
| 1 | 1 | No mask enable will occur unless both mask vectors are 1. |

Such granularity in selection of masking options for each scan vector empowers the simulation software to arrive at a more optimal masking solution to minimize the amount of over-masking and ensure a broad collection of usable test data.

Returning to FIG. 2, as the second least significant bit 2061 of the scan chain $206_1$ contains an X-value, (while this is considered the most significant bit from the viewpoint of the MISR—it is referred to herein uniformly as a "least" significant bit for clarity and consistency) the selector unit $222_1$ of the mask controller 203 is preferably preloaded to a 1 value with the pre-sense that masking is needed for the channel data. The mask controller 203 applies the corresponding masking bit of the bit mask pattern to the X-value from scan chain $206_1$ to mask the X-value in location 2061 via the inverter $225_1$ and OR gate $226_1$ to control the logic value input to one input to AND gate $227_1$ and thereby effectively prevent that X-value from reaching the circuit fingerprinting unit 104 (shown as MISR unit).

Yet another alternative configuration of system 100 is shown in FIG. 3 and employs a plurality of internal scan vector units 320 and 321 for storing a respective plurality of composite mask patterns. BIST controller 302 includes a plurality of separately addressable selector units F1 and F2 (322 and 324) for selective application of either, both, or neither of the mask patterns stored in internal mask vector 320 or 321 to a particular scan chain unit 306. With the two selector units 322 and 324, four possible mask conditions are able to be selectively employed for each scan chain unit 306. If, for example, selector units 322 and 324 are both set to 0, then either mask pattern will control and be applied to the scan chain unit 306 (a logical OR operation of the plural mask patterns). If one of: the selector unit 322 or, disjunctively, selector unit 324, is employed, then a corresponding mask pattern in the internal mask vector unit 320 or mask vector unit 321 will be selectively applied to the scan chain 306 when the circuit fingerprint unit 104 captures the values of the operational scan results therein. If both selector units 322 and 324 are activated with a "1" value, then no channel masking will be performed unless the plural mask patterns are "1" (a logical AND operation of the plural mask patterns). With an X at 3061, selector units 322 and 324 would be preset by the simulator software according to the location of the X-value 3061 in scan vector 306 to allow for the masking data to be applied by internal mask vector 321 to the scan chain 306.

As scan chain unit 306 is seen to include an identified bit location 3061 containing an X-value, the second internal mask vector 321 is selectively applied by the selector unit 324 due to the second bit location 3202 containing a corresponding masking value therefor. Selector units 322 and 324 are accordingly modulated to selectively employ one of the composite mask patterns in the internal mask vector units 320 and 321 with respective ones of the scan chain units 306.

For a particular example, with the establishment of X-value 3061 in the second right-most bit position of scan chain 306, and corresponding masking values established in internal mask vector units 320 and 321, the second bit value "1" of internal mask vector 321 is used to mask off the X-value 3061.

Firstly, the simulator concatenates both a 0 and 1 value to at least one of the generated masking patterns transmitted to be stored in internal mask vectors 320 and 321 during their loading from the simulator. Then, these concatenated values are separated and loaded into mask selector units 322 and 324 as "1" and "0" respectively. For the first bit 3201 (least significant/rightmost/position 1) of internal mask vector 320, the value is "1." This value of "1" applied to a signal trace and an inverter at OR gate 330 results in a "0" at a first input pin of the OR gate 330. Mask selector 322, being preset to "1" is applied to a signal trace leading to a second input pin of OR gate 330. As this second input pin is "1," OR gate 330 applies a "1" signal to a signal trace leading to AND gate 327.

The least significant/rightmost bit 3202 of internal mask vector unit 321 is "0," which is applied to a signal trace connected to an inverter 325 which inverts the value to "1" and then applies the "1" to OR gate 326. Mask selector unit 324 has been preset during loading to be "0." When the "1" input and the "0" input are both applied to the OR gate 326, a "1" value is output via a signal trace to AND gate 327.

Internal mask vector unit 320 least significant bit 3201 is established above to have a "1" value which is applied to a first input pin of AND gate 328. Likewise, the least significant bit 3202 of internal mask vector unit 321 is established to have a "0" value which is applied to a second input pin of AND gate 328. As the first and second input pins are not both "1", AND gate 328 outputs a "0" value to an output pin thereof. However, an inverter inverts the "0" value to a "1" value to be applied across a signal trace to an input pin of AND gate 327.

The least significant/rightmost bit of scan vector 306 is a "0" value which is applied to a signal trace which leads to an input pin of AND gate 327. Following the readout of the "0" in scan chain unit 306, the remainder of more significant bits are shifted right one position to allow for capture of the next bit. Inasmuch as the input applied from scan chain 306 was a "0" value (i.e. not all input pins to AND gate 327 are "1"), AND gate 327 applies the "0" value to the MISR and no masking takes place even though OR gate 330 and OR gate 326 both applied a "1" to the AND gate 327.

The same process is described below for the masking of bit location two of the scan vector unit 306. The second bit-wise location of scan vector unit 306 is seen to be an X-value which is applied via a signal trace to the first input pin of AND gate 327.

Mask selector unit 322 is pre-established (as discussed above) to have a value of "1" which is applied to the first input pin of OR gate 330. The second bit location value of "0" of internal mask vector unit 320 is applied to the second input pin of OR gate 330 where it is inverted to a value of "1." Inasmuch as at least one of the input pins of OR gate 330 is "1," OR gate 330 applies a value of "1" via an output pin to a signal trace leading to the second input pin of AND gate 327.

Both the second location bit value "0" of internal mask vector unit 320 and the second location bit value "1" of internal mask vector unit 321 are applied via signal traces to input pins of AND gate 328. AND gate 328, having received only one "1" value outputs a "0" value from an output pin thereof where it is inverted to be a "1" value by an inverter connected thereto. The "1" value is applied via a signal trace to the fourth input pin of the AND gate 327.

Mask selector unit 324 is pre-established (as discussed above) to have a value of "0" which is applied to the first input pin of OR gate 326. The second bit location value of "1" of internal mask vector unit 321 is applied to the second input pin of OR gate 326 where it is inverted to be a value of "0." Inasmuch as neither input pin to OR gate 326 is "1," OR gate 326 applies a value of "0" via an output pin to a signal trace leading to the third input pin of AND gate 327. Thus, the X-value 3061 in the second location of scan vector unit 306 is masked from propagating on to the MISR unit.

As seen in the method outlined in FIG. 4, a first step of mode initiation at block 401 is presented. A user may employ a circuit simulation application on a computer processing unit or units. For example, a user may employ an Encounter Test (ET) application to generate an LBIST signature. The simulation system is informed of the location of the pseudo random pattern generator (PRPG) and the circuit fingerprint unit 104 which may include a multiple input signature register (MISR). The user defines where the PRPG and the circuit fingerprint unit 104 are located in the integrated circuit (IC). Such indication may be performed by loading a HDL file defining the IC and BIST and the user selecting both the PRPG and the circuit fingerprint unit 104. The simulation program verifies that the PRPG and circuit fingerprint unit 104 (for example linear feedback shift registers which may be included in each) match their defined polynomial operational definitions to ensure predictability in results from the pseudo random pattern generator (PRPG) and the fingerprint unit 104 responsive to known input values. Additionally, a user specifies a clocking sequence to be used and a clock frequency to be tested. A signature is then calculated based on the intended runtime for the LBIST in the hardware. For example, with a multiple input signature register such as may be employed in system 100 for the circuit fingerprint unit 104, input is continuously shifted through a feedback channel. Accordingly, 10,000 iterations of an LBIST may result in a different value than 5,000 iterations of an LBIST. Thus, the signature is calculated based upon the known pattern generator (PRPG) and circuit fingerprint unit 104 along with clock speed and run length. The simulation application such as Encounter Test (ET) may employ a command such as "create_LBIST_tests" to receive the above parametric information and accordingly calculate a functional fingerprint therefor. Additionally, the simulation tool will identify where X-values that will be captured into the simulated scan vector units $106_1$-$106_n$. During the first execution in the simulation application, X-values that will be in the simulated scan vector units $106_n$-$106_n$ are identified. In a second simulation execution, a composite mask pattern is adaptively generated based on the X-values identified as being the simulated scan vector units $106_1$-$106_n$.

In the simulation, the composite masking pattern is then adaptively applied to the values in scan vector units $106_1$-$106_n$ to mask the X-values and thereby effectively prevent the X-values from reaching the simulated circuit fingerprint unit 104. As previously discussed, the mask pattern compensates replaces X-values by substituting a predetermined known logic value such as "0" or "1" therefore, a "0" being used in the exemplary implementation shown in the drawing figures. However, the predetermined substitute value used in the examples provided herein is not disclosed in a limiting sense as the logic of mask controller 102 may be designed to employ a composite mask pattern to replace X-values with 0s, 1s, Zs, or any other logical value. Additionally, it is contemplated that the mask controller 102 may replace the values in the scan chain units $106_1$-$106_n$ themselves, such as by direct insertion. However, in the examples presented herein the mask controller 102 selectively masks the values such that they don't influence the signature generated in the circuit fingerprint unit 104. It is further contemplated that the mask controller 102 may retroactively remove X-values from the circuit fingerprint unit 104.

The simulation application being run on the processing unit(s) performs a second functional fingerprint generation step after the composite mask pattern has been successfully generated. Therefore, the final signature or functional fingerprint will be devoid of X-values values and the design of the IC may be successfully validated.

As discussed above, it is seen that the location of all X-values that will be in any of the multiple scan chain units $106_1$-$106_n$, both spatially and temporally, through a specified number of iterations of the LBIST execution are identified. Responsively, the mask pattern is generated in an over-inclusive manner, owing to the reuse of the mask pattern of the internal mask vector unit, to ensure that all X-values are automatically masked from affecting the signature generated in the circuit fingerprint unit 104. Additionally, a circuit designer may specify predetermined locations in the IC design or the scan chain units $106_1$-$106_n$ to be treated as X-values and also effectively prevented from affecting the signature generated in the circuit fingerprint unit 104. A user may also selectively specify which portions of the circuit are to be ignored or treated as an X-value selectively at different intended operating frequencies.

For example, the IC operating at a first operating frequency may not be subject to X-values identified in the simulation thereof. However, operating the same IC at a higher operating frequency might result in setup or hold timing violations which result in X-values being seen in the scan chain units $106_1$-$106_n$. Accordingly, a user may selectively specify certain locations to be treated as X-values at certain predetermined operating frequencies thereof. The composite mask pattern(s) are then generated to effectively identify the locations of all bit-wise locations to be masked in the built-in self test (BIST).

As mentioned above, the simulation application is preferably provided with a data store, such as an HDL, representing the configuration of the IC device and the built-in self test system portion. In such manner, the simulation tool may appropriately determine the amount of hardware necessary to implement an optimal masking solution. The circuit simulation application may adjustably reconfigure the IC design to implement the masking solution with predetermined hardware, responsive to the identification of X-values determined in the scan chain units $106_1$-$106_n$ thereof.

For example, if the generated mask pattern is seen to be above a threshold over-inclusivity value such that a relatively large amount of useable diagnostic data is being prevented from reaching the circuit fingerprint unit 104, then the simulation tool may selectively employ alternate configurations, such as with a plurality of different mask patterns in corresponding internal mask vector units 320 and 321 with one or plural selector units 322 and 324 or selectively apply the single mask pattern. Selector units 322 and 324 may include an indicia, marker, or flag implemented with a flip flop, register or other device to indicate that the composite masking pattern should be used on a specific scan chain unit $106_1$-$106_n$ and perhaps excluded on others. If, for example, a certain scan chain unit $106_1$-$106_n$ had no X-values identified therein, then a selector unit 322 coupled to the scan chain unit would indicate the obviated need of applying the composite masking pattern thereto, as previously described.

Additionally, if it is seen that the scan chain units may be better suited by two or more masking patterns, the simulation tool may responsively determine this from the identification of X-values in the scan chains and suitably employ additional masking pattern logic and internal mask vector units 120 as may be needed.

The final calculated signature for the circuit fingerprint unit 104 is then preferably loaded into the LBIST of the IC in step 403. Such loading of the signature may be effected through a JTAG, side scan, pin interface, or the like. The mask pattern is preloaded into at least one internal mask vector units 120. This is done before LBIST execution on the IC as the LBIST, once executed, executes to completion without accepting external input except for a clock signal if the clock generator is not included in the particular LBIST. The mask is loaded at block 405 in similar manner to the final signature or functional fingerprint as discussed above.

At concurrently executed blocks 407 and 408, pseudo random patterns are input to the functional logic circuits of the IC during the LBIST from the PRPG pattern generator. The functional logic is sequenced by the LBIST which then captures logic values at defined test points in scan chain units. The values in the scan chain units are logically combined with the composite masking pattern and the results therefrom, including masked bits, are captured by the circuit fingerprint unit 104. Each masking bit of the internal mask vector unit 120 is sequentially output to the masking control unit 102 and used to selectively mask X-values in the scan chain units corresponding in location to the mask pattern bits. Each masking bit value is also fed back to a most significant bit position of the internal mask vector unit 120 and to fill that bit position as the masking pattern is shifted rightwards (towards a least significant bit position). In such manner, masking enable bits are maintained in registration with bit locations of the scan chain units $106_1$-$106_n$ which themselves are shifted out to the masking control unit 102 for generation of the signature in the circuit fingerprint unit 104.

At block 410 the circuit fingerprint unit 104 (shown as including a MISR) is unloaded or compared with the final signature (or functional fingerprint) calculated in block 401 discussed above. If the fingerprint contained in the circuit fingerprint unit 104 corresponds to the final signature calculated at block 401, then the LBIST may output a signal indicating successful completion of the built-in self test. Alternatively, the calculated signature stored in the circuit fingerprint unit 104 may be output for comparison with an expected value external to the IC.

As seen in FIG. 5, a first scan chain unit $506_1$, second scan chain unit $506_1$, and $n^{th}$ scan chain unit $506_n$ are illustratively shown. A selector unit 522 preferably includes a plurality of flip flops respectively corresponding with the different scan chain units $506_1$-$506_n$. Here, the bit-wise value of the selector unit 522 selectively controls application of the mask pattern in the internal mask vector unit 520 to the output of a particular scan chain unit $506_1$-$506_n$. For example, as seen in the selector unit 522, the uppermost two values are zero indicating that the composite mask pattern in mask vector unit 520 should be applied to the first two scan chain units $506_1$ and $506_n$. Accordingly, it is seen that X-values in corresponding bit locations 5067 are effectively separated from the circuit fingerprint unit 104. Additionally, the one X-value in bit location 5068 of scan chain unit $506_1$ is masked, but also a valid test result, a "0", is masked as well. The third bit-wise position (lowermost) of the selector unit 522 is a "1" value which preferably indicates that the composite mask pattern in mask vector unit 520 should not be employed to the scan vector unit $506_n$. This selector unit 522 may be selectively set according to an identification of presence or absence of any X-values in a particular scan chain unit. In such manner, scan vector units $506_1$ and $506_2$ with identified X-values are bit-wise selectively masked according to the mask pattern in mask vector unit 520 whereas a scan vector unit $506_n$, which is devoid of X-values, is not masked by the mask pattern in mask vector unit 520. Thereby, only known-good diagnostic data, i.e. "0" and "1" values, are able to successfully propagate through to the circuit fingerprint unit 104, herein including a multiple input signature register (MISR) 530.

The MISR 530, in this example, will be evaluated after completion of the LBIST to determine if the values remaining therein are consistent with the final calculated signature or functional fingerprint from the simulation tool.

Another masking configuration is illustratively shown in FIG. 6, where a plurality of mask selector bits are stored in Mask Registers R0 and R1 and whose outputs are represented by the Mask Bit 0 and Mask Bit 1, respectively $622_1$ and $622_n$. Mask Bit 0 and Mask Bit 1, $622_1$ and $622_n$, selectively apply the internal mask vector units represented as CME0 and CME1 $620_1$ and $620_n$ to the diagnostic data in scan vector unit 606 coming from the functional logic of the IC under test. Mask enable bits in CME0 and CME1, $620_1$ and $620_n$, are selectively employed according to the mask selector registers $622_1$ and $622_n$ to provide, in this example four different masking schemes. This number of different schemes is preferably set in the simulation optimizer to balance the amount of additional BIST logic needed with the minimization of over-masking of good diagnostic data. In an exemplary configuration, depending upon the complexity of the IC under test, perhaps 14 different mask patterns may be selectively employed with four bit mask selector registers.

In the first illustrated scheme, where the mask selector bits $622_1$ and $622_n$ are both "0", none of the masking bits of mask patterns stored in internal mask vector units $620_1$ or $620_n$ will be applied. In a second scheme, where the mask selector bit $622_1$ is selectively set to have a "1" value and the mask selector bit $622_n$ is selectively set to a "0", the first mask pattern $620_1$ will be selectively applied to the output of scan chain unit 606. In a third scheme, where the mask selector bit $622_1$ is set to "0" and the mask selector bit $622_n$ is set to "1", the second mask pattern $620_n$ is selectively applied to output of the scan chain unit 606. In a final scheme, where both the mask selector bit $622_1$ and mask selector bit $622_n$ are each selectively set to be "1", the multiple mask patterns $620_1$ and $620_n$ are applied in a logical bit-wise OR pattern (in other words, wherever at least one mask pattern has a value of "1") to output of the scan chain unit 606 through the AND gate 624.

This is merely an exemplary configuration arrived at through optimization measures in the simulator to determine a narrowly tailored masking approach to reduce over-masking and ensure that substantially no X-values reach the MISR. In an alternative configuration, for example, "0" and "0" values respectively in the mask selector registers $622_1$ and $622_n$ may selectively employ a logical bit-wise AND operation on the internal mask vectors $622_1$ and $622_n$ amongst other configurations. FIG. 7 illustrates execution of a BIST in accordance with the prior example, as seen in FIGS. 3 and 6. This exemplary BIST uses a plurality of scan vector units $706_1$-$706_n$ which are each provided with a plurality of mask selector units (collectively shown as 722). The scan vector units $706_1$-$706_n$ are sequentially logically combined in bit-wise fashion (according to a masking logic network) with the mask vector units $720_1$-$720_n$ to be masked by the patterns of one or both of the mask vector units (as discussed above). There is seen to be a substantial variation in the number of X-values between the different scan chain units $706_1$-$706_n$ and especially between chains zero and one ($706_1$ and $706_2$) on the one hand, and chain n ($706_n$), on the other hand. In this example, two mask selector units (collectively shown as 722) are provided for each scan vector $706_1$-$706_n$. A plurality of mask enable bits are provided in the internal mask enable vector units $720_1$ and $720_n$ and are selectively employed (according to the mask selector registers 722) to control which mask pattern(s), if any is/are to be applied to the outputs of the scan vector units $706_1$-$706_n$ for masking thereof. As the Mask selector bits 722 corresponding to scan vector unit $706_n$ are set as "1" and "1," a logical AND of the mask vector units $720_1$-$720_n$ is performed and only corresponding mask bit locations that both have "1" values will mask the value in scan vector unit $706_n$. This logical bit-wise AND operation is demonstrated at the eighth bit location from the right of the scan vector units $720_1$-$720_n$ where all of internal mask vector units $720_1$-$720_n$ have a "1" value. Accordingly, the corresponding bit location of the scan vector unit $706_n$ is masked, whereas, no other bit locations are masked though the individual internal mask vector units $720_1$-$720_n$ do have "1" values. It is only where these "1" values coincide between both/all internal scan vector units that the bit-wise logical AND operation operates to mask values in the scan vector units $706_1$-$706_n$.

In another example, where both mask selector bits 722 are set to "0" a logical bit-wise OR operation would be performed on the internal mask vector units $720_1$-$720_n$ which would arrive at an effective mask vector pattern of "1011010101001" from the OR operation on mask pattern $720_1$: "0010010100000" with mask pattern $720_n$: "1001010001001." Thereby, plural mask patterns are combined.

Turning to FIG. 9, an exemplary block diagram of a computer system for hosting and/or executing an exemplary configuration of the disclosed system and method is illustrated. A computer system 1000 contains a processor unit 1001, a main or primary memory 1004, an interconnect bus 1006, a mass storage device 1002, peripheral device(s) 1010, input control device(s) 1012, portable storage drive(s) 1014, a graphics subsystem 1016, and an output display 1018, amongst other components (components may be used herein at varying levels such as a gate component or a black-box type component such as, for example, the main memory component). Processor unit 1001 may include a single microprocessor or a plurality of microprocessors for configuring computer system 1000 as a multi-processor system, additionally, each physical processor unit 1001 may include a plurality of cores. Main memory 1004 stores, in part, instructions and data to be executed by processor 1001 along with circuit design data including timing data. Main memory 1004 preferably includes banks of dynamic random access memory (DRAM) as well as high-speed cache memory, such as static random access memory (SRAM) at various levels of the system architecture.

For the purpose of simplicity, the components of computer system 1000 are shown connected via interconnect bus 1006. However, computer system 1000 may be connected through one or more data transport means. Mass storage device 1002, which may be implemented with a magnetic disk drive, an optical disk drive, a solid state device, an attachment to network storage, cloud storage, a RAID arraying any of the above, and the like, is preferably a non-volatile storage device for storing data, databases, and instructions, to be used by processor unit 1001. In certain configurations, mass storage device 1002 may store portions of the software to load it into main memory 1004 or into a firmware or rom.

Portable storage medium drive 1014 operates in conjunction with a portable non-volatile storage medium such as a floppy disk, a compact disk read only memory (CD-ROM), or a digital versatile/video disk read only memory (DVD-ROM), to input and output data and code to and from the computer system 1000. In one configuration, software portions, circuit design data, and the like are stored on such a portable medium, and are input to computer system 1000 via portable storage medium drive 1014.

Peripheral device(s) 1010 may include any type of computer support device such as an input/output (I/O) interface, to add additional functionality to computer system 1000. For example, peripheral device(s) 1010 may include additional network interface cards to interface computer system 1000 to additional networks. Peripheral devices may include further specialized processors such as clustered video cards utilizing graphics processor unit (GPU) floating point processing logic to supplement or supplant CPU processing. Dynamically configurable logic such as, for example, field programmable gate arrays (FPGAs) may also be coupled to system 1000 through peripheral device(s) block 1010. The IC with BIST may be coupled via a JTAG port, TDI, or the like to receive the composite mask pattern and the calculated final signature or functional fingerprint. Additionally, signatures or fingerprints may be read out of the circuit fingerprint unit 104. Still further, specialized application specific integrated circuits (ASICS) or modules may be coupled thereto to implement specialized logic to accelerate or implement certain portions of the disclosed system and method. Such modules may be given direct access to memory (DMA) and may have their own memory integrated therein. Additionally, a rapid circuit prototype fabrication unit may be coupled to the system via a backplane or system IO port. Such fabrication unit may include, for example, a lithographic or 3d additive printer, operable to physically fabricate a circuit design defined by physical implementation data for example representing the Integrated Circuit (IC) with an integrated built in self test system.

Input control device(s) 1012 provide a portion of the user interface for a computer system 1000 user. Input control device(s) 1012 may include an alphanumeric keypad for inputting alphanumeric and other key information; and a cursor control device such as a mouse, a track pad or stylus; or cursor direction keys.

In order to display textual and graphical information, computer system 1000 contains graphic subsystem 1016 and output display(s) 1018. Output display 1018 may include a cathode ray tube (CRT) display, liquid crystal display (LCD), active matrix organic light emitting diode (AMOLED), plasma display, projector, or the like. Graphic subsystem 1016 receives textual and graphical information and processes the information for output to display 1018.

In a software implementation, the portions of software for certain measures may include a plurality of computer executable instructions, to be implemented on a computer system such as system 1000. Prior to loading in the computer system 1000 or firmware, the software may reside as encoded information on a computer-readable tangible medium such as a magnetic floppy disk, a magnetic tape, CD-ROM, DVD-ROM, flash memory, network attached storage (NAS), or any other suitable computer readable medium. Such software may control multiplexors, selectors, field programmable gate arrays (FPGAs), or the like to implement simulation features.

In an illustrative implementation, such a system may be implemented in any suitable computer based platform known in the art. For example, the system may comprise suitable storage media and one or more dedicated processors or share one or more processors executing/controlling other functions, wherein the employed processor(s) is programmably configured with processor instructions for performing the functions described herein. Suitable circuits may also be developed to execute certain aspects of these functions.

For clarity, the term BIST is used throughout. In practice, the instant system and method may be employed in any suitable BIST, such as, for example, Logical BIST, Programmable BIST (pBIST), Memory BIST (mBIST), Continuous BIST (CBIST), Periodic BIST, Interrupt-driven BIST (IBIST), User-initiated BIST, Automatic BIST (ABIST), Power-up BIST (PupBIST), Analog and Mixed-Signal BIST (AMBIST), and the like.

While the term "bit-wise" has been used herein, the selective masking may be employed selectively to any suitable data item in a scan result. For example, the selective masking herein may be employed against any unit of information regardless of base, such as trits, bytes, quantum bits (qubits), portions of an analog wavetrain, and the like.

While the masking presented herein has focused primarily on operational scan results, the selective masking solution may be applied to any suitable type of scan results, such as operational scan results, functional test results, timing, structural signature, checksum, cyclic-redundancy-check (CRC), hash value, digest value, and the like.

The descriptions above are intended to illustrate possible implementations of the present invention and are not restrictive. While this invention has been described in connection with specific forms and embodiments thereof, it will be appreciated that various modifications other than those discussed above may be resorted to without departing from the spirit or scope of the invention. Such variations, modifications, and alternatives will become apparent to the skilled artisan upon review of the disclosure. For example, functionally equivalent elements or method steps may be substituted for those specifically shown and described, and certain features may be used independently of other features, and in certain cases, particular locations of elements or sequence of method steps may be reversed or interposed, all without departing from the spirit or scope of the invention as defined in the appended Claims. The scope of the invention should therefore be determined with reference to the description above and the appended claims, along with their full range of equivalents.

What is claimed is:

1. A built in self test system incorporated in an integrated circuit (IC), the system having mask pattern storage on the IC, the system comprising:
   a test controller executing a plurality of scan iterations on operational portions of the IC to generate a plurality of bits representing operational scan results from a scan iteration;
   at least one scan vector unit maintaining the plurality of bits representing the operational scan results from a scan iteration;
   at least one internal mask vector unit actuated for cyclically maintaining a composite mask pattern formed by a plurality of values set for a series of bit-wise masking locations, the set values of the bit-wise masking locations being cyclically sequenced for application to the plurality of scan iterations of the IC, the composite mask pattern being sized no greater than the plurality of bits representing the operational scan results of a single scan iteration;
   masking circuitry actuated for logically combining a received bit-wise masking location value from the composite mask pattern with a corresponding received one of the plurality of bits representing the operational scan results; and,
   a circuit signature unit coupled to the masking circuitry executed to generate a signature representing the operational scan results.

2. The system as recited in claim 1, wherein the composite mask pattern is sized to be equivalent to the plurality of bits representing the operational scan results of a single scan iteration.

3. The system as recited in claim 1, wherein the composite mask pattern is sized to be of an evenly-divided portion of the plurality of bits representing the operational scan results of a single scan iteration.

4. The system as recited in claim 1, wherein the series of bit-wise masking location values of the internal mask vector unit are selectively set to indicate X-values pre-identified in the plurality of bits representing operational scan results in the at least one scan vector unit.

5. The system as recited in claim 1, wherein the masking circuitry includes a masking logic network.

6. The system as recited in claim 5, wherein the masking logic network includes a plurality of logic gates, each coupled with a respective scan vector unit and the internal mask vector unit for selectively masking the plurality of bits representing the operational scan results with the composite mask pattern to quarantine X-values from reaching the circuit signature unit.

7. The system as recited in claim 6, further comprising:
   a plurality of scan vector units, each maintaining a plurality of bits representing operational scan results from a scan iteration; and,
   a plurality of internal mask vector units, each maintaining a composite mask pattern therein, the plurality of internal mask vector units being selectively applied to the plurality of scan vector units according to a predetermined set of factors including the locations of X-values in each scan vector unit.

8. The system as recited in claim 7, wherein the masking logic network further comprises a plurality of sequential memory units with at least one operably coupled to each scan vector unit to selectively apply at least one composite mask pattern thereto.

9. The system as recited in claim 8, wherein a plurality of flip flops are operably coupled to each scan vector unit to selectively apply at least one of:
   a first composite mask pattern;
   a second composite mask pattern;
   a combination of the first and second composite mask patterns; and,
   no masking.

10. The system as recited in claim 9, wherein the circuit signature unit includes a multiple input shifting register and the internal mask vector units each include a shifting register.

11. The system as recited in claim 10, wherein the internal mask vector units each include a feedback channel to feedback a bit output from a least significant bit position to the most significant bit position and correspondingly shift others of the plurality of bits representing the composite mask pattern to less significant bit positions to cyclically maintain the respective composite mask pattern in registration with the plurality of scan vector units.

12. The system as recited in claim 1, wherein the internal mask vector unit includes a feedback channel to feedback a bit output from a least significant bit position to the most significant bit position and correspondingly shift others of the plurality of bits representing the composite mask pattern to less significant bit positions to cyclically maintain the respective composite mask pattern in registration with the plurality of scan vector units.

13. The system as recited in claim 1, further comprising a pseudo random pattern generator (PRPG) disposed on the IC and coupled to the test controller to provide a plurality of pseudo random input patterns to the IC.

14. A method for generating a composite mask pattern for Built In Self Test (BIST) of an Integrated Circuit (IC), the method comprising:
   receiving a digital representation of an integrated circuit (IC) having a built in self test controller including at least an internal mask vector unit, masking circuitry, a scan vector unit, and a circuit signature unit;
   executing a processing unit to simulate operation of the IC executing a plurality of scan iterations on operational portions of the IC to generate a plurality of bits representing operational scan results from a scan iteration, the operational scan results being maintained in the scan vector unit;
   identifying bitwise locations of the scan vector unit storing X-values of the operational scan results therein for each of the plurality of scan iterations;
   generating a composite mask pattern having a bit length no greater than the plurality of bits representing the operational scan results of a single scan iteration, the composite mask pattern formed by a plurality of values set for a series of bit-wise masking locations, each of the bit-wise masking location values of the composite mask pattern being set according to the identified locations of X-values in the scan vector unit for the plurality of scan iterations of the IC; and applying the composite mask pattern to adaptively mask for the identified X-values of the scan vector unit to normalize an operational circuit signature to be substantially devoid of X-values, the adaptive masking by logically combining a received bit-wise masking location value from the composite mask pattern with a corresponding received one of the plurality of bits representing the operational scan results, the set values of the bit-wise masking locations being cyclically sequenced for said logical combination.

15. The method as recited in claim 14, wherein the composite mask pattern is maintained in cyclical bitwise registration with at least a portion of the operational scan results in the scan vector unit, the mask vector unit recycling masking bit values for masking of the operational scan results.

16. The method as recited in claim 15, further comprising generating a plurality of composite mask patterns according to the identified locations of X-values in the operational scan results.

17. The method as recited in claim 16, further comprising selectively applying the plurality of composite mask patterns to the scan vector unit according to the identified locations of X-values in the operational scan results.

18. A method for built in self test incorporated in an integrated circuit (IC), the IC having mask pattern storage on the IC, the method comprising:

actuating a test controller to execute a plurality of scan iterations on operational portions of the IC to generate a plurality of bits representing operational scan results from a scan iteration;

maintaining, in at least one scan vector unit, the plurality of bits representing the operational scan results from a scan iteration;

cyclically maintaining, in at least one internal mask vector unit, a composite mask pattern for each internal mask vector unit formed by a plurality of values set for a series of bit-wise masking locations, the set values of the bit-wise masking locations being cyclically sequenced for application to the plurality of scan iterations of the IC, the composite mask pattern being sized no greater than the plurality of bits representing the operational scan results of a single scan iteration and being used for each scan iteration;

actuating a masking circuitry for logically combining a received bit-wise masking location value from the composite mask pattern with a corresponding received one of the plurality of bits representing the operational scan results; and, maintaining, in a circuit signature unit coupled to the masking circuitry, a signature representing the operational scan results of the IC.

19. The method as recited in claim 18, where the cyclic maintenance further includes cyclically maintaining a plurality of composite mask patterns in a corresponding plurality of internal mask vector units and selectively applying the plurality of mask patterns respectively to a plurality of scan vector units.

20. The method as recited in claim 19, where the cyclic maintenance further includes providing at least one mask register coupled to the masking circuitry for preventing bits in a scan vector unit that is devoid of X-values from being masked by the composite mask pattern.

* * * * *